(12) United States Patent
Yoshida et al.

(10) Patent No.: US 11,462,673 B2
(45) Date of Patent: Oct. 4, 2022

(54) PIEZOELECTRIC SUBSTRATE ATTACHMENT STRUCTURE AND SENSOR MODULE

(71) Applicant: Mitsui Chemicals, Inc., Tokyo (JP)

(72) Inventors: Mitsunobu Yoshida, Nagoya (JP); Kazuhiro Tanimoto, Ichihara (JP); Masahiko Mitsuzuka, Yokohama (JP)

(73) Assignee: MITSUI CHEMICALS, INC., Tokyo (JP)

( * ) Notice: Subject to any disclaimer, the term of this patent is extended or adjusted under 35 U.S.C. 154(b) by 847 days.

(21) Appl. No.: 16/335,513

(22) PCT Filed: Sep. 22, 2017

(86) PCT No.: PCT/JP2017/034392
§ 371 (c)(1),
(2) Date: Mar. 21, 2019

(87) PCT Pub. No.: WO2018/062056
PCT Pub. Date: Apr. 5, 2018

(65) Prior Publication Data
US 2019/0214542 A1 Jul. 11, 2019

(30) Foreign Application Priority Data
Sep. 27, 2016 (JP) .............................. JP2016-188600

(51) Int. Cl.
*H01L 41/087* (2006.01)
*H01L 41/053* (2006.01)
(Continued)

(52) U.S. Cl.
CPC .............. *H01L 41/087* (2013.01); *G01L 1/16* (2013.01); *H01L 41/053* (2013.01);
(Continued)

(58) Field of Classification Search
CPC ... H01L 41/087; H01L 41/053; H01L 41/1132
See application file for complete search history.

(56) References Cited

U.S. PATENT DOCUMENTS 5,325,011 A  6/1994 Kahn et al.
5,376,859 A * 12/1994 Kim ...................... H01L 41/183
310/334

(Continued)

FOREIGN PATENT DOCUMENTS

EP  0358390 A2  3/1990
EP  0614235 A1  9/1994
(Continued)

OTHER PUBLICATIONS

English Translation of JP 2008-183181 (Year: 2008).*
(Continued)

*Primary Examiner* — Bryan P Gordon
(74) *Attorney, Agent, or Firm* — Buchanan Ingersoll & Rooney PC

(57) ABSTRACT

A piezoelectric substrate attachment structure including a cable-shaped piezoelectric substrate, a press section provided adjacent to the piezoelectric substrate and pressed from an opposite side from the piezoelectric substrate, and a base section provided adjacent to the piezoelectric substrate on an opposite side from the press section. A ratio Eb/Ea of a Young's modulus Eb of the base section to a Young's modulus Ea of the press section being $10^{-1}$ or lower.

13 Claims, 15 Drawing Sheets

(51) Int. Cl.
  *H01L 41/193* (2006.01)
  *G01L 1/16* (2006.01)
  *H01L 41/113* (2006.01)

(52) U.S. Cl.
  CPC ........ *H01L 41/113* (2013.01); *H01L 41/1132* (2013.01); *H01L 41/193* (2013.01)

(56) References Cited

U.S. PATENT DOCUMENTS

| | | | |
|---|---|---|---|
| 5,663,507 A | | 9/1997 | Westervelt et al. |
| 2015/0155474 A1* | | 6/2015 | Tanimoto ............... C08G 63/08 29/25.35 |
| 2019/0003905 A1* | | 1/2019 | Yoshida ................ H01L 41/113 |

FOREIGN PATENT DOCUMENTS

| FR | 2 681 730 A1 | 3/1993 |
|---|---|---|
| JP | 2181621 A | 7/1990 |
| JP | 10132669 A | 5/1998 |
| JP | 2005153675 A1 | 6/2005 |
| JP | 2005351781 A | 12/2005 |
| JP | 2008146528 A | 6/2008 |
| JP | 2008183181 A | 8/2008 |
| JP | 2010071840 A | 4/2010 |

OTHER PUBLICATIONS

Google search of modulus of elasticity of epoxy (Year: 2022).*
Google search of modulus of elasticity of metal (Year: 2022).*
Google search of modulus of elasticity of rubber (Year: 2022).*
The Extended European Search Report dated Mar. 27, 2020, by the European Patent Office in corresponding European Patent Application No. 17856009.0. (7 pages).
International Search Report (PCT/ISA/210) dated Oct. 17, 2017, by the Japanese Patent Office as the International Searching Authority for International Application No. PCT/JP2017/034392.
Written Opinion (PCT/ISA/237) dated Oct. 17, 2017, by the Japanese Patent Office as the International Searching Authority for International Application No. PCT/JP2017/034392.
First Notice of Opinion of Examination dated Apr. 30, 2020, by the State Intellectual Property Office of the People's Republic of China in corresponding Chinese Patent Application No. 201780056650.X and a partial English translation of the Notice. (10pages).

* cited by examiner

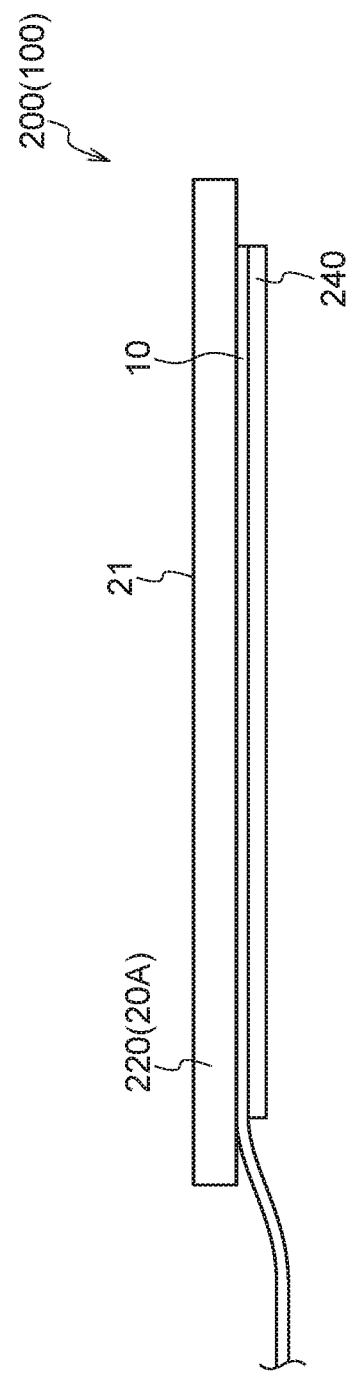

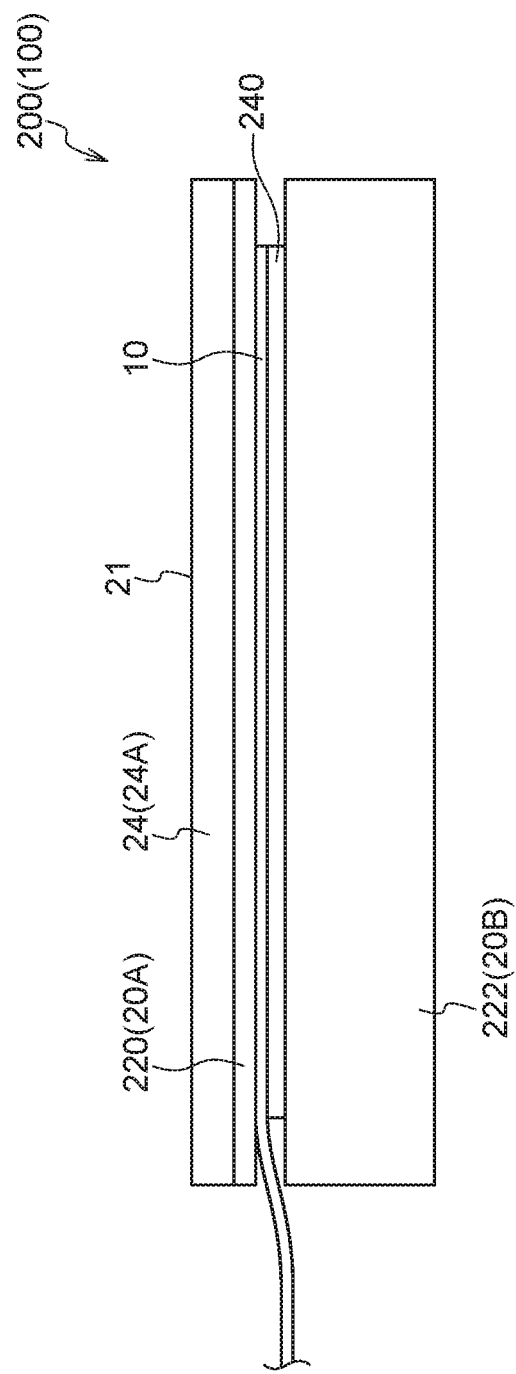

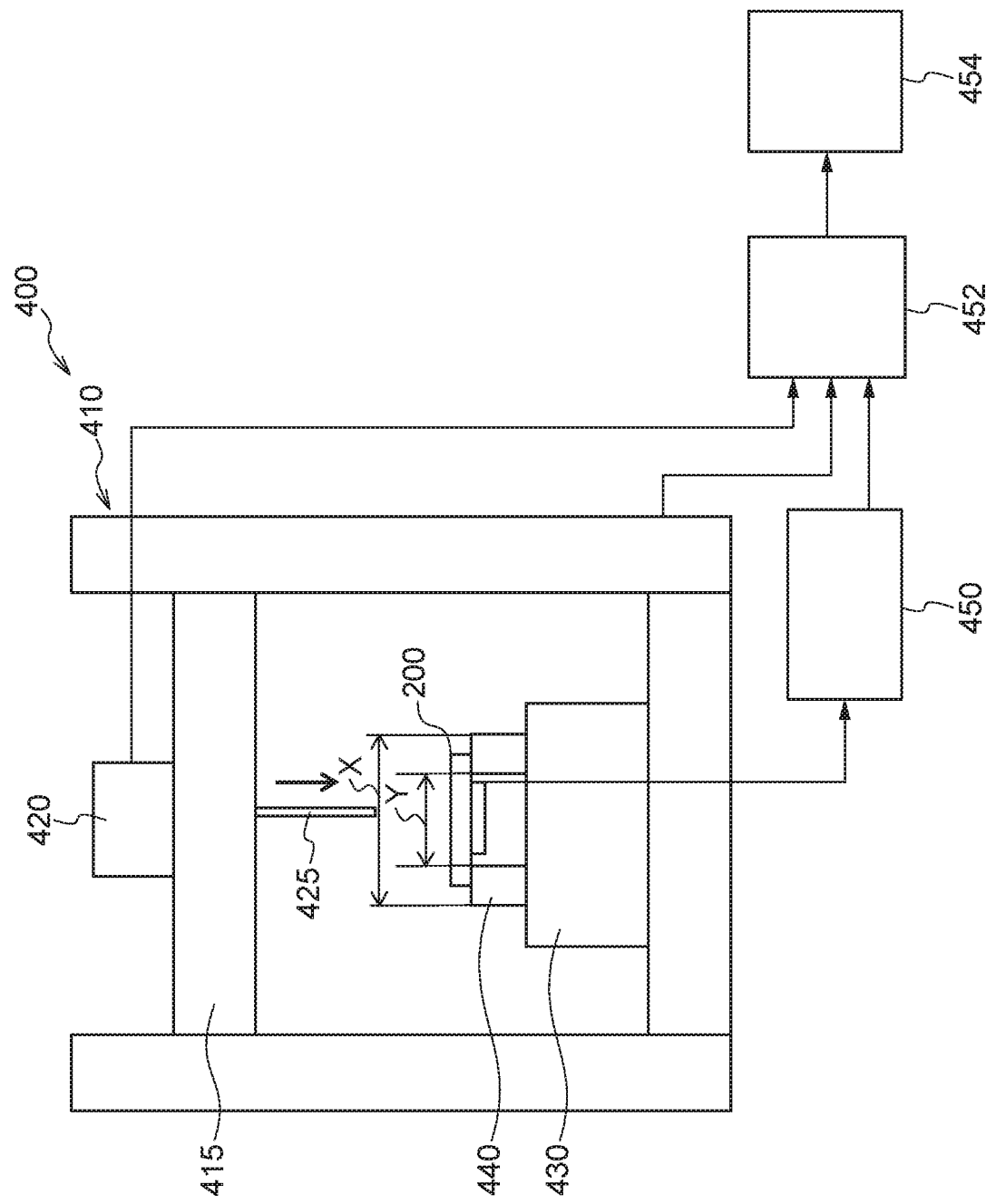

1

PIEZOELECTRIC SUBSTRATE ATTACHMENT STRUCTURE AND SENSOR MODULE

TECHNICAL FIELD

The present invention relates to a piezoelectric substrate attachment structure and a sensor module.

BACKGROUND ART

There have recently been trials utilizing a material having piezoelectric properties covering a conductor.

For example, known piezoelectric cables include configurations having a central conductor, a piezoelectric material layer, an outer conductor, and a sheath arranged coaxially to each other in this sequence from the center to the outside (see, for example, Patent Documents 1 and 2). In the piezoelectric cables of Patent Documents 1 and 2, it is the piezoelectric cables themselves that configure pressure detection devices.

However, pressure detection devices incorporating piezoelectric cables as sensors are also being produced. For example, Patent Document 3 discloses a bed device capable of detecting a human body in which a piezoelectric cable arranged in a wavy shape is incorporated into a mattress. Moreover, for example, Patent Document 4 discloses an intruder alarm device in which a piezoelectric cable arranged in a wavy shape is incorporated within a sensor mat having a waterproof and dustproof configuration made from a urethane rubber.

Patent Document 1: Japanese Patent Application Laid-Open (JP-A) No. H10-132669
Patent Document 2: JP-A No. 2010-071840
Patent Document 3: JP-A No. 2005-351781
Patent Document 4: JP-A No. 2008-146528

SUMMARY OF INVENTION

Technical Problem

However, in the piezoelectric detectors disclosed in Patent Documents 3 and 4, the piezoelectric cable is arranged on a pressure-applied face in a wavy shape in order to widen the detection range and in order to secure detection sensitivity. There is, however, issues with such an approach in that the structure becomes more complicated and production costs are increased due to the piezoelectric cable being arranged on the pressure-applied face in a wavy shape.

An object of one aspect in the invention is to provide a piezoelectric substrate attachment structure and a sensor module that enable the length of piezoelectric substrate to be shortened while still maintaining sensitivity as a sensor.

Solution to Problem

Specific means to solve the problem are as follows.
<1> A piezoelectric substrate attachment structure including a cable-shaped piezoelectric substrate, a press section provided adjacent to the piezoelectric substrate and pressed from an opposite side from the piezoelectric substrate, and a base section provided adjacent to the piezoelectric substrate on an opposite side from the press section. A ratio Eb/Ea of a Young's modulus Eb of the base section to a Young's modulus Ea of the press section is $10^{-1}$ or lower.
<2> The piezoelectric substrate attachment structure of <1>, wherein the Young's modulus Ea of the press section is in a range of from $10^{-6}$ to $10^3$ GPa, and the Young's modulus Eb of the base section is in a range of from $10^{-7}$ to $10^1$ GPa.
<3> The piezoelectric substrate attachment structure of <1>, wherein the Young's modulus Ea of the press section is in a range of from $10^{-3}$ to $10^3$ GPa, and the Young's modulus Eb of the base section is in a range of from $10^{-5}$ to $10^1$ GPa.
<4> The piezoelectric substrate attachment structure of <1>, wherein the Young's modulus Ea of the press section is in a range of from $10^{-2}$ to $10^1$ GPa, and the Young's modulus Eb of the base section is in a range of from $10^{-3}$ to $10^{-1}$ GPa.
<5> The piezoelectric substrate attachment structure of any one of claims 1 to 4, wherein a support section configured from one or plural layers is provided adjacent to the base section on an opposite side from the piezoelectric substrate.
<6> The piezoelectric substrate attachment structure of <5>, wherein the Young's modulus Eb of the base section is lower than a Young's modulus Ec of a layer of the support section adjacent to the base section.
<7> A sensor module including a cable-shaped piezoelectric substrate, a press section provided adjacent to the piezoelectric substrate and pressed from an opposite side from the piezoelectric substrate, a base section provided adjacent to the piezoelectric substrate on an opposite side from the press section, and a main body configured by an integrated unit of the press section and the base section. A Young's modulus Ef of the main body is in a range of from $10^{-3}$ to $10^1$ GPa.
<8> The sensor module of <7>, wherein a thickness of the press section in a direction of adjacency to the piezoelectric substrate is greater than a thickness of the base section in the adjacency direction.
<9> A piezoelectric substrate attachment structure including a cable-shaped piezoelectric substrate, and a press section provided adjacent to the piezoelectric substrate and pressed from an opposite side from the piezoelectric substrate. A Young's modulus Ea of the press section is in a range of from $10^{-3}$ to $10^1$ GPa.
<10> The piezoelectric substrate attachment structure of any one of <1> to <6> and <9>, further including a covering section configured from one or plural layers provided adjacent to the press section on a pressure-applied side thereof.
<11> The piezoelectric substrate attachment structure of <10>, wherein the Young's modulus Ea of the press section is greater than a Young's modulus Ed of a layer of the covering section adjacent to the press section.
<12> A piezoelectric substrate attachment structure including a cable-shaped piezoelectric substrate, and a press section provided adjacent to the piezoelectric substrate and pressed from an opposite side from the piezoelectric substrate. A length of the piezoelectric substrate adjacent to the press section is different to a length of a contact portion of the piezoelectric substrate contacting the press section.

Advantageous Effects

An aspect in the invention enables a piezoelectric substrate attachment structure and a sensor module to be provided that enable a length of a piezoelectric substrate to be shortened while still maintaining sensitivity as a sensor.

BRIEF DESCRIPTION OF DRAWINGS

FIG. 9 is a side view of a sensor module of an Example 1.

FIG. 14 is a side view of a sensor module of a Comparative Example 2.

FIG. 15 is a face-on view of a load-application/charge-generation-amount detection instrument.

DESCRIPTION OF EMBODIMENTS

Embodiments in the invention will be described below. The invention is not limited to the following embodiments.

Herein, a numerical range represented by "from A to B" means a range including numerical values A and B as a lower limit value and an upper limit value, respectively.

Herein, "principal faces" of each of elongate-flat-plate-shaped piezoelectric materials (a first piezoelectric material and a second piezoelectric material) means faces perpendicular to the thickness direction of the elongate-flat-plate-shaped piezoelectric material (i.e., is faces including a lengthwise direction and a width direction thereof).

Herein, a "face" of a member means a "principal face" of the member unless otherwise specified.

Herein, a thickness, a width, and a length satisfy a relationship of thickness<width<length, as in the usual definitions thereof.

Herein, "adhesion" is a concept including "pressure sensitive adhesion". "Adhesive layer" is a concept including "pressure sensitive adhesive layer".

Herein, an angle formed between two line segments is expressed in a range of from 0° to 90°.

Herein, "film" is a concept including so-called "sheets" as well as so-called "films".

First Embodiment

As a first embodiment, description follows of a piezoelectric substrate attachment structure 100 (referred to below simply as "attachment structure 100") and a sensor module 200 equipped with the attachment structure 100, with reference to FIG. 1A to FIG. 4.

(Outline of Attachment Structure)

The attachment structure 100 according to the present embodiment includes a cable-shaped piezoelectric substrate 10, a press section 20A provided adjacent to the piezoelectric substrate 10 and pressed from the opposite side from the piezoelectric substrate 10, and a base section 20B provided adjacent to the piezoelectric substrate 10 on the opposite side from the press section 20A.

A pressure-applied face 21 is formed on a face on the opposite side of the press section 20A from the face contacting the piezoelectric substrate 10. The pressure-applied face 21 is a face pressed by contact, and functions as a measurement face to measure pressure. The base section 20B on the side opposite from the press section 20A, with the piezoelectric substrate 10 interposed therebetween, functions as a fixing member to fix the sensor module 200 to a mounting target.

Figure 1A:
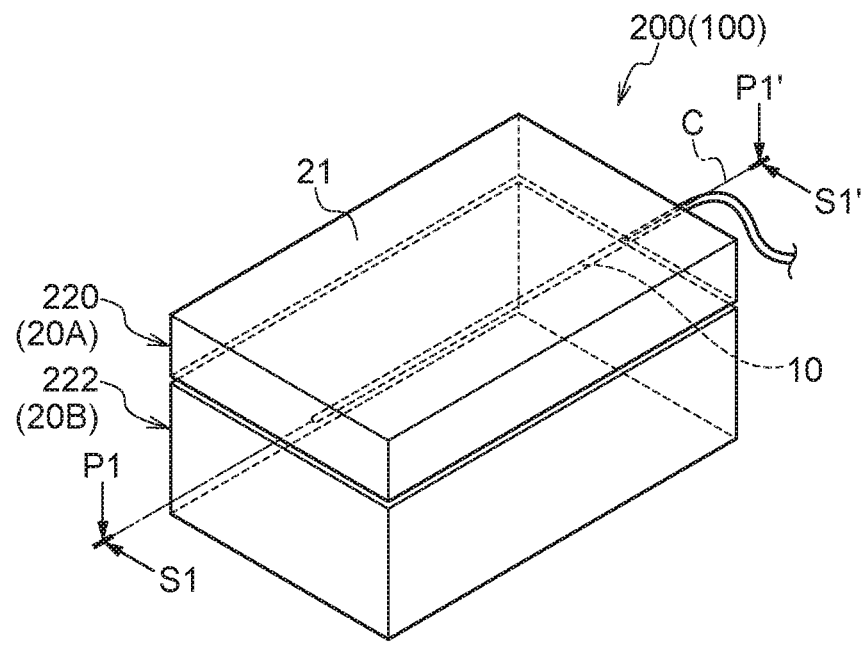
FIG. 1A is a perspective view of a sensor module of a first embodiment.
Figure 1B:
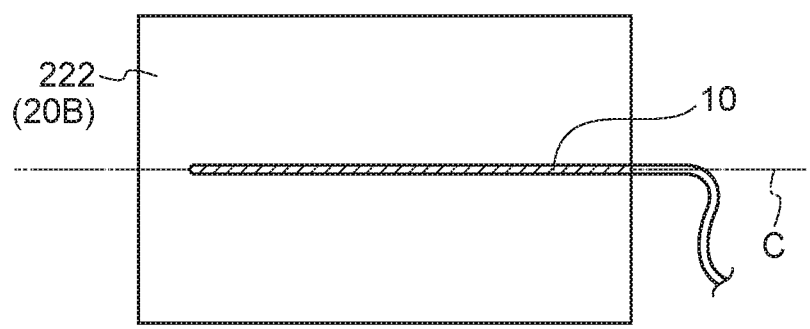
FIG. 1B is a plan view cross-section of the sensor module of the first embodiment.
Figure 1C:
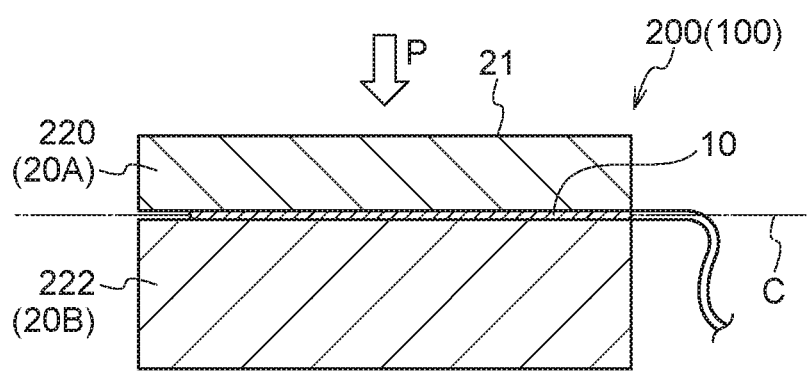
FIG. 1C is a side view cross-section of the sensor module of the first embodiment.

As illustrated in FIG. 1C, in the present embodiment, the press section 20A, the piezoelectric substrate 10, and the base section 20B are arranged along a pressure-application direction of pressure borne by the pressure-applied face 21 (an arrow P direction). The piezoelectric substrate 10 is provided with its axial direction in a direction intersecting with the pressure-application direction (i.e. in the straight line C direction).

In the attachment structure 100 of the present embodiment, a ratio Eb/Ea of a Young's modulus Eb of the base section 20B to a Young's modulus Ea of the press section 20A is $10^{-1}$ or lower.

The present inventors have discovered that it is possible to shorten the length of the piezoelectric substrate 10 while still detecting pressure applied to the press section 20A with a high sensitivity by setting the ratio Eb/Ea of the Young's modulus Eb of the base section 20B to the Young's modulus Ea of the press section 20A so as to be $10^{-1}$ or lower In the present embodiment, preferably the Young's modulus Ea of the press section 20A is in a range of from $10^{-6}$ to $10^3$ GPa and the Young's modulus Eb of the base section 20B is in the range of from $10^{-7}$ to $10^1$ GPa. More preferably, the Young's modulus Ea of the press section 20A is in a range of from $10^{-3}$ to $10^3$ GPa, and the Young's modulus Eb of the base section 20B is in the range of from $10^{-5}$ to $10^1$ GPa. Particularly preferably, the Young's modulus Ea of the press section 20A is in the range of from $10^{-2}$ to $10^1$ GPa, and the Young's modulus Eb of the base section 20B is in the range of from $10^{-3}$ to $10^{-1}$ GPa.

(Sensor Module)

Next, a sensor module 200 equipped with the attachment structure 100 of the present embodiment will be described below.

FIG. 1A is a perspective view of the sensor module 200 of the present embodiment. The sensor module 200 of the present embodiment has a cuboidal external appearance, and includes a first member 220 and a second member 222 for placing the first member 220 on. In the present embodiment, the first member 220 corresponds to the press section 20A, and the second member 222 corresponds to the base section 20B.

FIG. 1B is a plan view cross-section (cross-section along a plane parallel to a principal face) of the sensor module 200 sectioned along a boundary at the axis of the piezoelectric substrate 10 (straight line C), and is a cross-section taken along line P1-P1' of FIG. 1A. As illustrated in FIG. 1B, the piezoelectric substrate 10 is a cable-shaped piezoelectric substrate 10 extending in a straight line from one end to the other end in a lengthwise direction.

FIG. 1C is a side view cross-section (cross-section taken along the thickness direction) of the sensor module 200 sectioned along a boundary at the axis of the piezoelectric substrate 10 (straight line C), and is a cross-section taken along line S1-S1' of FIG. 1A. As illustrated in this figure, the sensor module 200 of the present embodiment is formed by sandwiching the cable-shaped piezoelectric substrate 10 between the first member 220 and the second member 222.

The following materials may be employed as the first member 220.

Materials that may be employed therefor include: an organic gel; an inorganic gel; an elastomer such as a silicone elastomer, an acrylic elastomer, a urethane elastomer, a fluorine-based elastomer, a perfluoro elastomer, an isoprene rubber, a butadiene rubber, a styrene-butadiene rubber, natural rubber, a chloroprene rubber, a nitrile rubber, a butyl rubber, an ethylene propylene rubber, and an epichlorohydrin rubber; a polymer material such as polyethylene, polypropylene, polystyrene, polyvinylchloride, polyethylene terephthalate, a polycarbonate, polyamide, a polyvinyl alcohol, polyacetal, a polyimide, polyester, a cyclic polyolefin, a styrene-acrylonitrile copolymer, a styrene-butadiene-acrylonitrile copolymer, an ethylene-vinyl acetate copolymer, a methacrylic-styrene copolymer, an acrylic resin, a fluororesin, a urethane resin, a phenol resin, a urea resin, an epoxy resin, a cellulose-based resin, an unsaturated polyester resin, a melamine resin, a silicone resin, a copolymer or alloy thereof, a modified product thereof, and a foamed product (foam) thereof; a metal material such as aluminum, iron, steel, copper, nickel, cobalt, titanium, magnesium, tin, zinc, lead, gold, silver, platinum, or an alloy thereof; timber; glass; and the like.

A layered body configured from plural of the above materials may also be employed.

The following materials may be employed as the second member 222.

Materials that may be employed therefor include: an organic gel; an inorganic gel; an elastomer such as a silicone elastomer, an acrylic elastomer, a urethane elastomer, a fluorine-based elastomer, a perfluoro elastomer, an isoprene rubber, a butadiene rubber, a styrene-butadiene rubber, natural rubber, a chloroprene rubber, a nitrile rubber, a butyl rubber, an ethylene propylene rubber, and an epichlorohydrin rubber; a polymer material such as polyethylene, polypropylene, polystyrene, polyvinylchloride, polyethylene terephthalate, a polycarbonate, polyamide, a polyvinyl alcohol, polyacetal, a polyimide, polyester, a cyclic polyolefin, a styrene-acrylonitrile copolymer, a styrene-butadiene-acrylonitrile copolymer, an ethylene-vinyl acetate copolymer, a methacrylic-styrene copolymer, an acrylic resin, a fluororesin, a urethane resin, a phenol resin, a urea resin, an epoxy resin, a cellulose-based resin, an unsaturated polyester resin, a melamine resin, a silicone resin, a copolymer or alloy thereof, a modified product thereof, and a foamed product (foam) thereof; a timber; a cushioning member including fibers such as cotton and wool fibers; and the like.

A layered body configured from plural of the above materials may also be employed.

Forming the present embodiment such that the ratio Eb/Ea of the Young's modulus Eb of the base section 20B (i.e. the second member 222) to the Young's modulus Ea of the press section 20A (i.e. the first member 220) is $10^{-1}$ or lower results in the following operation and advantageous effects being exhibited. First, in the press section 20A (i.e. the first member 220), pressure is readily transmitted to the piezoelectric substrate 10 irrespective of the pressed location that is pressed on the pressure-applied face 21. Moreover, the piezoelectric substrate 10 readily bends in the pressure-application direction (the arrow P direction in FIG. 1C) in the base section 20B (i.e. the second member 222). This thereby enables pressure applied to the press section 20A to be detected at high sensitivity. In the present embodiment, it is sufficient to lay the piezoelectric substrate 10 in a straight line with respect to the pressure-applied face 21. The piezoelectric substrate 10 does not need to be laid over the entire surface of the pressure-applied face 21 in, for example, a wavy shape or a flat-spiral shape. Namely, the length of the piezoelectric substrate 10 can be shortened.

(Method of Producing the Sensor Module)

In order to produce the sensor module 200 of the present embodiment, first the piezoelectric substrate 10 is laid in a straight line on the surface of the second member 222. The sensor module 200 is then formed by placing the first member 220 on top of both the second member 222 and the piezoelectric substrate 10, and fixing the first member 220 thereto.

In the sensor module 200 of the present embodiment, a covering member covering the piezoelectric substrate 10 possesses pressure sensitive self-adhesive properties. This means that the piezoelectric substrate 10 is fixed to the first member 220 and the second member 222 by utilizing the pressure sensitive self-adhesive properties of the covering member.

Moreover, outer peripheral edge portions of the first member 220 and the second member 222 are fixed together by an adhesive agent (not illustrated in the drawings). Note that the method employed to fix the first member 220 and the second member 222 together is not limited to fixing by adhesive agent, and they may be fixed together using a pressure sensitive adhesive or a pressure sensitive adhesive tape (such as a double-sided tape, for example).

When fixing the piezoelectric substrate 10, raised portions on the sensor module due to the volume of the piezoelectric substrate 10 can be prevented from arising by forming a groove corresponding to the piezoelectric substrate 10 in the surface of one or other out of the first member 220 or the second member 222.

(Piezoelectric Substrate)

An outline of the piezoelectric substrate employed to detect pressure in the attachment structure 100 of the present embodiment will now be described.

The piezoelectric substrate of the present embodiment includes an elongate conductor, and an elongate first piezoelectric material helically wound in one direction around the conductor. The first piezoelectric material includes an optically active helical chiral polymer (A) (hereinafter also simply referred to as "helical chiral polymer (A)"). A lengthwise direction of the first piezoelectric material and a principal orientation direction of the helical chiral polymer (A) included in the first piezoelectric material are substantially parallel to each other. The first piezoelectric material has a degree of orientation F in a range of from 0.5 up to but not including 1.0, determined from X-ray diffraction measurement by the following Formula (a):

$$\text{degree of orientation } F = (180° - \alpha)/180° \quad \text{(a).}$$

In Formula (a), α represents a half width of a peak due to orientation. The unit of α is "°".

In the following description of the piezoelectric substrate of the present embodiment, "elongate conductor" may be simply referred to in the description as "conductor", and "elongate first piezoelectric material" may be simply referred to in the description as "first piezoelectric material".

Here, the degree of orientation F of the first piezoelectric material is an index indicating the degree of orientation of the helical chiral polymer (A) included in the first piezoelectric material, such as a degree of orientation in a c-axis measured by a wide-angle X-ray diffractometer (RINT 2550 manufactured by Rigaku Corporation, attachment device: rotational sample table, X-ray source: CuKα, output: 40 kV, 370 mA, detector: scintillation counter).

Examples of a method of measuring the degree of orientation F of the first piezoelectric material are as described in examples described later.

"One direction" refers to a direction in which the first piezoelectric material is wound around the conductor from the near side to the far side when viewing the piezoelectric substrate of the present embodiment from one axial direction end of the conductor. Specifically, "one direction" refers to a right direction (right-handed, i.e., clockwise) or a left direction (left-handed, i.e., counterclockwise).

Due to including such a configuration, the piezoelectric substrate of the present embodiment is excellent in piezoelectric sensitivity and also excellent in the piezoelectric output stability.

More specifically, the piezoelectric substrate of the present embodiment exhibits piezoelectric properties due to the first piezoelectric material including the helical chiral polymer (A), the lengthwise direction of the first piezoelectric material and the principal orientation direction of the helical chiral polymer (A) being substantially parallel to each other, and the degree of orientation F of the first piezoelectric material being from 0.5 up to but not including 1.0.

Moreover, the piezoelectric substrate of the present embodiment has a configuration in which the first piezoelectric material is helically wound in one direction around the conductor.

In the piezoelectric substrate of the present embodiment, due to the first piezoelectric material being arranged in the manner described above, a shear force is applied to the helical chiral polymer (A) when tension (stress) has been applied to the piezoelectric substrate in the lengthwise direction, and polarization of the helical chiral polymer (A) occurs along the radial directions of the piezoelectric substrate. When the helically wound first piezoelectric material is regarded as being an aggregate body of micro regions micronized to the extent that they approximate to flat planes along the lengthwise direction of the first piezoelectric material, application to the helical chiral polymer of a shear force caused by tension (stress) acting on the flat planes configuring the micro regions results in the direction of such polarization substantially coinciding with the direction of an electric field generated due to a piezoelectric stress constant $d_{14}$.

Specifically, in polylactic acids for example, in the case of a homopolymer (PLLA) of L-lactic acid having a molecular structure including a left-handed helical structure, application of tension (stress) to a left-handed helically wound structure, in which a first piezoelectric material having a lengthwise direction substantially parallel to the principal orientation direction of the PLLA has been wound around a conductor in a left-handed manner, results in generation of an electric field (polarization) parallel to radial directions and acting in directions from the center of a circle of a circular cross-section perpendicular to the tension toward the outside. Conversely, when tension (stress) has been applied to a right-handed helically wound structure, in which a first piezoelectric material piezoelectric material having a lengthwise direction substantially parallel to the principal orientation direction of the PLLA has been wound around a conductor in a right-handed manner, this results in generation of an electric field (polarization) parallel to radial directions, but acting in directions from the outside of a circle of a circular cross-section perpendicular to the tension toward the center thereof.

Moreover, for example, in the case of a homopolymer (PDLA) of D-lactic acid having a molecular structure including a right-handed helical structure, application of tension (stress) to a left-handed helically wound structure, in which a first piezoelectric material having a lengthwise direction substantially parallel to the principal orientation direction of the PDLA has been wound around a conductor in a left-handed manner, results in generation of an electric field (polarization) parallel to radial directions and acting in directions from the outside of a circle of a circular cross-section perpendicular to the tension, toward the center thereof. Conversely, when tension (stress) is applied to a right-handed helically wound structure, in which a first piezoelectric material piezoelectric material having a lengthwise direction substantially parallel to the principal orientation direction of the PDLA has been wound around a conductor in a right-handed manner, this results in generation of an electric field (polarization) parallel to radial directions, but acting in directions from the center of a circle of a circular cross-section perpendicular to the tension, toward the outside As a result, when tension has been applied to the piezoelectric substrate in the lengthwise direction, a voltage signal proportional to this tension is thought to be effectively detectable due to respective potential differences proportional to the tension being generated at each site of the helically arranged first piezoelectric material in a state of phase alignment.

Therefore, a piezoelectric substrate that is excellent in piezoelectric sensitivity and also excellent in the piezoelectric output stability can be obtained according to the piezoelectric substrate of the present embodiment.

In particular, the stability of piezoelectric sensitivity and the piezoelectric output stability (stability with respect to time or change in temperature) in a piezoelectric substrate using a non-pyroelectric polylactic acid-based polymer as the helical chiral polymer (A) are improved in comparison to those of a piezoelectric substrate using PVDF that has pyroelectric properties.

In the piezoelectric unit provided with a fiber having piezoelectric properties described in Patent Document 4, the direction in which the fiber having piezoelectric properties is wound around a conductive fiber is not limited therein, and both origin and direction of force configuring a shear force are different from those of the piezoelectric substrate of the present embodiment. Piezoelectric sensitivity is accordingly thought to be insufficient due to polarization not occurring along the radial directions of the piezoelectric unit. Namely, polarization does not occur in the direction of an electric field generated due to a piezoelectric stress constant $d_{14}$, even in cases in which tension is applied to the piezoelectric unit described in Patent Document 4.

The lengthwise direction of the first piezoelectric material and the principal orientation direction of the helical chiral polymer (A) being substantially parallel to each other is advantageous from the perspective of the first piezoelectric material being strong to tension in the lengthwise direction (i.e., has excellent tensile strength in the lengthwise direction). The first piezoelectric material is accordingly not liable to break even when being helically wound in one direction around the conductor.

In addition, the lengthwise direction of the first piezoelectric material and the principal orientation direction of the helical chiral polymer (A) being substantially parallel to each other is also advantageous from the perspective of ease of manufacture when, for example, a stretched piezoelectric film is slit to obtain the first piezoelectric material (for example, a slit ribbon thereof).

Herein, "substantially parallel" indicates that an angle formed between two line segments is from 0° up to but not including 30° (preferably from 0° to 22.5°, more preferably from 0° to 10°, still more preferably from 0° to 5°, and particularly preferably from 0° to 3°).

Herein, the principal orientation direction of the helical chiral polymer (A) means the main orientation direction of the helical chiral polymer (A). The principal orientation direction of the helical chiral polymer (A) can be confirmed by measuring the degree of orientation F of the first piezoelectric material.

In cases in which a raw material is melted and spun before stretching to produce the first piezoelectric material, the principal orientation direction of the helical chiral polymer (A) in the produced first piezoelectric material means the principal stretching direction. The principal stretching direction refers to the direction in which stretching is performed.

Likewise, in cases in which a film is stretched, and slits are made in the stretched film to produce the first piezoelectric material, the principal orientation direction of the helical chiral polymer (A) in the produced first piezoelectric material means a principal stretching direction. The principal stretching direction refers here to the stretching direction in cases of monoaxial stretching, or refers here to the stretching direction having the higher stretching ratio in cases of biaxial stretching.

A first embodiment of the piezoelectric substrate in the invention will be described in detail below.

(Piezoelectric Substrate of First Embodiment)

In the piezoelectric substrate of the first embodiment, the elongate conductor is preferably an inner conductor, and the elongate first piezoelectric material is preferably helically wound in one direction around the outer peripheral surface of the inner conductor.

Utilizing the inner conductor as the conductor facilitates the helical arrangement of the first piezoelectric material in one direction while maintaining the first piezoelectric material at a helix angle β with respect to the axial direction of the inner conductor.

"Helix angle β" means here an angle formed between the axial direction of the conductor and the arrangement direction of the first piezoelectric material with respect to the axial direction of the conductor (the lengthwise direction of the first piezoelectric material).

This facilitates the generation of polarization of the helical chiral polymer (A) along the radial directions of the piezoelectric substrate when, for example, tension is applied in the lengthwise direction of the piezoelectric substrate. As a result, a voltage signal (charge signal) proportional to the tension is effectively detected as an electrical characteristic.

In addition, a piezoelectric substrate configured as described above has the same structure as the internal structure provided in a coaxial cable (i.e. an inner conductor and a dielectric body). A structure that has high electromagnetic shielding properties and is resistant to noise is accordingly obtained when, for example, the piezoelectric substrate described above is applied to a coaxial cable.

The piezoelectric substrate of the first embodiment preferably further includes an elongate second piezoelectric material helically wound in a direction different from the one direction.

In addition, preferably the second piezoelectric material includes an optically active helical chiral polymer (A), the lengthwise direction of the second piezoelectric material and the principal orientation direction of the helical chiral polymer (A) included in the second piezoelectric material are substantially parallel to each other, the degree of orientation F of the second piezoelectric material, determined from X-ray diffraction measurement by Formula (a), is in a range of from 0.5 up to but not including 1.0, and the chirality of the helical chiral polymer (A) included in the first piezoelectric material and the chirality of the helical chiral polymer (A) included in the second piezoelectric material differ from each other.

Polarization thereby occurs in both the helical chiral polymer (A) included in the first piezoelectric material and the helical chiral polymer (A) included in the second piezoelectric material when, for example, tension has been applied in the lengthwise direction of the piezoelectric substrate. Each of these polarization directions is along the radial directions of the piezoelectric substrate.

As a result, a voltage signal (charge signal) proportional to the tension is more effectively detected. Accordingly, piezoelectric sensitivity and piezoelectric output stability are further improved.

In particular, in cases in which the piezoelectric substrate of the first embodiment includes a first outer conductor and a piezoelectric material formed into a double-layer structure that includes the first piezoelectric material and the second piezoelectric material, the first piezoelectric material and the second piezoelectric material can be brought into close contact with the inner conductor and the first outer conductor so as to form few voids therebetween. This facilitates efficient transmission of an electric field generated by tension to an electrode. Such a form of the piezoelectric material is accordingly well suited to achieving a sensor of higher sensitivity.

From the viewpoint of improving piezoelectric sensitivity and piezoelectric output stability, the piezoelectric substrate of the first embodiment preferably further includes a first insulator helically wound around the outer peripheral surface of the inner conductor, and the first insulator is preferably arranged on the opposite side from the inner conductor as viewed from the first piezoelectric material.

For example, in cases in which the piezoelectric substrate of the first embodiment includes a first outer conductor, gaps are readily formed in the wound first piezoelectric material if the piezoelectric substrate is repeatedly bent or the piezoelectric substrate is bent at a small curvature radius, giving rise to the possibility of the inner conductor and the first outer conductor electrically short-circuiting. Arranging the first insulator in such cases, however, enables the inner conductor and the first outer conductor to be more reliably electrically isolated from each other. This also enables high reliability to be achieved in applications employing a bent piezoelectric substrate.

Preferably the piezoelectric substrate of the first embodiment further includes an elongate second piezoelectric material wound in a direction different from the one direction.

Herein, the second piezoelectric material includes an optically active helical chiral polymer (A), a lengthwise direction of the second piezoelectric material and a principal orientation direction of the helical chiral polymer (A) included in the second piezoelectric material are substantially parallel to each other, a degree of orientation F of the second piezoelectric material, determined from X-ray diffraction measurement by Formula (a), is in a range of from 0.5 up to but not including 1.0. The first piezoelectric material and the second piezoelectric material alternately intersect each other to form a braided structure, and a chirality of the helical chiral polymer (A) included in the first piezoelectric material and a chirality of the helical chiral polymer (A) included in the second piezoelectric material differ from each other.

Polarization thereby accordingly occurs in both the helical chiral polymer (A) included in the first piezoelectric material and the helical chiral polymer (A) included in the second piezoelectric material when, for example, tension has been applied in the lengthwise direction of the piezoelectric substrate. Each of these polarization directions is along the radial directions of the piezoelectric substrate.

A voltage signal proportional to the tension is thereby more effectively detected. As a result the piezoelectric sensitivity and piezoelectric output stability are further improved.

In particular, in cases in which the piezoelectric substrate of the first embodiment includes a first outer conductor and a piezoelectric material including the first piezoelectric material and the second piezoelectric material formed into a braided structure, an appropriate level of voids is formed between the first piezoelectric material and the second piezoelectric material. The voids accordingly absorb deformation when a force acts on the piezoelectric material to cause bending deformation therein, facilitating supple bending deformation of the piezoelectric substrate. This thereby enables the piezoelectric substrate of the first embodiment to be suitably used, for example, as a configuration member to be conformed to a three-dimensional plane, such as in a wearable product.

From the viewpoint of improving piezoelectric sensitivity and piezoelectric output stability, the piezoelectric substrate of the first embodiment preferably further includes a first insulator wound around the outer peripheral surface of the inner conductor, wherein the first piezoelectric material and the first insulator alternately intersect each other to form a braided structure.

This makes it easier to maintain a state in which the first piezoelectric material is wound around the inner conductor in one direction when the piezoelectric substrate is undergoing bending deformation. There are preferably no gaps between the first piezoelectric material and the first insulator in the braided structure of such an aspect from the viewpoint that this facilitates the application of tension to the first piezoelectric material.

From the viewpoint of improving piezoelectric sensitivity and piezoelectric output stability, in the piezoelectric substrate of the first embodiment, the first piezoelectric material is preferably wound so as to maintain an angle of from 15° to 75° (45°±30°), and more preferably wound so as to maintain an angle of from 35° to 55° (45°±10°), with respect to the axial direction of the inner conductor.

From the viewpoint of improving piezoelectric sensitivity and piezoelectric output stability, in the piezoelectric substrate of the first embodiment, the first piezoelectric material preferably has a fiber shape that includes a single or plural bundles, and the major axis diameter of a cross-section of the first piezoelectric material is preferably from 0.0001 mm to 10 mm, more preferably from 0.001 mm to 5 mm, and still more preferably from 0.002 mm to 1 mm.

"Major axis diameter of cross-section" is equivalent to "diameter" in cases in which a cross-section of the first piezoelectric material (preferably a fibrous piezoelectric material) has a circular profile.

In cases in which a cross-section of the first piezoelectric material has an irregular profile, the "major axis diameter of cross-section" is the longest width from out of such cross-sectional widths.

In cases in which the first piezoelectric material is a piezoelectric material configured from plural bundles, the "major axis diameter of cross-section" is the major axis diameter of a cross-section of the piezoelectric material configured from the plural bundles.

From the viewpoint of improving the piezoelectric sensitivity and piezoelectric output stability in the piezoelectric substrate of the present embodiment (for example, in the piezoelectric substrate of the first embodiment), the first piezoelectric material preferably has an elongate flat plate shape. The thickness of the first piezoelectric material is from 0.001 mm to 0.2 mm, the width of the first piezoelectric material is from 0.1 mm to 30 mm, and a ratio of the width of the first piezoelectric material to the thickness of the first piezoelectric material is 2 or more.

The dimensions (thickness, width, and ratios (width/thickness, and length/width)) of the first piezoelectric material having an elongate flat plate shape (hereinafter also referred to as "elongate-flat-plate-shaped piezoelectric material") will be described in more detail below.

The first piezoelectric material preferably has a thickness of from 0.001 mm to 0.2 mm.

A thickness of 0.001 mm or more secures the strength of the elongate-flat-plate-shaped piezoelectric material to be secured. This is also excellent in terms of ease of production of the elongate-flat-plate-shaped piezoelectric material.

A thickness of 0.2 mm or less results improves the degrees of freedom for deformation (flexibility) of the elongate-flat-plate-shaped piezoelectric material in the thickness direction.

In addition, the width of the first piezoelectric material is preferably from 0.1 mm to 30 mm.

A width of 0.1 mm or more secures the strength of the first piezoelectric material (elongate-flat-plate-shaped piezoelectric material). This is also excellent in terms of ease of production of the elongate-flat-plate-shaped piezoelectric material (for example, in terms of the ease of production in a slitting process, described later).

A width of 30 mm or less results in improvement in the degrees of freedom for deformation (flexibility) of the elongate-flat-plate-shaped piezoelectric material.

In addition, a ratio of the width of the first piezoelectric material to the thickness of the first piezoelectric material (hereinafter also referred to as "ratio (width/thickness)") is preferably 2 or more.

When the ratio (width/thickness) is 2 or more, the principal faces are clearly defined, thereby facilitating formation of an electrode layer (for example, an outer conductor) having a uniform orientation over the lengthwise direction of the first piezoelectric material (elongate-flat-plate-shaped piezoelectric material). For example, an outer conductor is easily formed on at least one of the principal faces. This is accordingly excellent in terms of piezoelectric sensitivity, and also excellent in terms of the stability of the piezoelectric sensitivity.

The width of the first piezoelectric material is more preferably from 0.5 mm to 15 mm.

When the width is 0.5 mm or more, there is a greater improvement in the strength of the first piezoelectric material (elongate-flat-plate-shaped piezoelectric material). In addition, twisting of the elongate-flat-plate-shaped piezoelectric material can also be better inhibited, thereby enabling the piezoelectric sensitivity and the stability thereof to be further improved.

A width of 15 mm or less results in a greater improvement in the degrees of freedom for deformation (flexibility) of the elongate-flat-plate-shaped piezoelectric material.

The ratio of the length to the width (hereinafter also referred to as "ratio (length/width)") of the first piezoelectric material is preferably 10 or more.

When the ratio (length/width) is 10 or more, there is a greater improvement in the degrees of freedom for deformation (flexibility) of the first piezoelectric material (elongate-flat-plate-shaped piezoelectric material). In addition, piezoelectric properties can be imparted more extensively to a piezoelectric device (such as a piezoelectric textile or a piezoelectric fabric) in which elongate-flat-plate-shaped piezoelectric materials are appropriately employed.

In the piezoelectric substrate of the present embodiment, a functional layer is preferably arranged on at least one principal face of the first piezoelectric material from the viewpoint of improving the piezoelectric sensitivity and piezoelectric output stability in cases in which the first piezoelectric material has an elongate flat plate shape.

The functional layer preferably includes at least one of an adhesion facilitation layer, a hard coat layer, an antistatic layer, an antiblock layer, a protective layer, or an electrode layer.

This further facilitates application to, for example, a piezoelectric device (such as a piezoelectric textile or a piezoelectric fabric), a force sensor, an actuator, or a biodata acquisition device.

The functional layer preferably includes an electrode layer.

This enables a connection between the first outer conductor and the conductor (preferably an inner conductor) to be more easily made in cases in which the piezoelectric substrate is being employed as one of the configuration elements of, for example, a piezoelectric device (such as a piezoelectric textile or a piezoelectric fabric), a force sensor, an actuator, or a biodata acquisition device. This facilitates detection of a voltage signal corresponding to tension when tension has been applied to the piezoelectric substrate of the present embodiment.

In the piezoelectric substrate of the present embodiment, preferably at least one surface layer of a layered body including the first piezoelectric material and the functional layer is the electrode layer.

This enables a connection between the first outer conductor or the conductor (preferably an inner conductor) and the layered body to be more easily made in cases in which the piezoelectric substrate is being employed as one of the configuration elements of, for example, a piezoelectric device (such as a piezoelectric textile or a piezoelectric fabric), a force sensor, an actuator, or a biodata acquisition device. This facilitates detection of a voltage signal corresponding to tension when tension has been applied to the piezoelectric substrate of the present embodiment.

In the piezoelectric substrate of the present embodiment, the conductor is preferably a tinsel wire.

The form of the tinsel wire has a structure in which a rolled copper foil is helically wound around a fiber. Employing copper that has a high electric conductivity enables the output impedance to be decreased. This facilitates detection of a voltage signal corresponding to tension when tension has been applied to the piezoelectric substrate of the present embodiment. As a result, piezoelectric sensitivity and piezoelectric output stability are further improved.

The piezoelectric substrate of the present embodiment preferably includes an adhesive layer between the conductor and the first piezoelectric material.

The relative position of the conductor and the first piezoelectric material is thereby inhibited from shifting, facilitating application of tension to the first piezoelectric material, and facilitating application of a shear stress to the helical chiral polymer (A) included in the first piezoelectric material. This enables a voltage output proportional to the tension to be effectively detected from the conductor (preferably a signal line conductor). The inclusion of the adhesive layer results in a further increase in the absolute value of the amount of generated charge per unit tensile force.

In the piezoelectric substrate of the present embodiment, the helical chiral polymer (A) included in the first piezoelectric material is preferably a polylactic acid-based polymer having a main chain including a repeating unit represented by the following Formula (1), from the viewpoint of further improving piezoelectric properties.

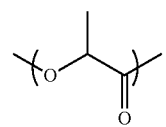

(1)

In the piezoelectric substrate of the present embodiment, the helical chiral polymer (A) included in the first piezoelectric material preferably has an optical purity of 95.00% ee or more, from the viewpoint of further improving piezoelectric properties.

In the piezoelectric substrate of the present embodiment, the helical chiral polymer (A) included in the first piezoelectric material is preferably D-form or L-form, from the viewpoint of further improving piezoelectric properties.

In the piezoelectric substrate of the present embodiment, the content of the helical chiral polymer (A) included in the first piezoelectric material is preferably 80% by mass or more with respect to the total amount of the first piezoelectric material, from the viewpoint of further improving piezoelectric properties.

The piezoelectric substrate of the present embodiment preferably further includes a first outer conductor at an outer periphery.

"Outer periphery" here means an outer peripheral portion of the piezoelectric substrate.

This enables electrostatic shielding to be achieved, and for fluctuations in the voltage of the conductor (preferably an inner conductor) arising from the effects of external static electricity to be suppressed.

The piezoelectric substrate of the present embodiment preferably further includes a second insulator at the outer periphery of the first outer conductor.

Due to the piezoelectric substrate of the present embodiment including the second insulator, the ingress of liquids such as water or sweat, and the ingress of dust or the like, from outside can be suppressed. This enables generation of leakage current between the conductor (preferably an inner conductor) and the outer conductor, caused by water, sweat, dust, or the like, to be suppressed. As a result, this enables a stable output to be achieved that is robust to various environmental changes and is not liable to fluctuate in sensitivity, in cases in which the piezoelectric substrate is used as one of the configuration elements of, for example, a piezoelectric device (such as a piezoelectric textile or a piezoelectric fabric), a force sensor, an actuator, or a biodata acquisition device.

A specific aspect A of the piezoelectric substrate according to the first embodiment will be described below, with reference to the drawings.

(Specific Aspect A)

Figure 2A:
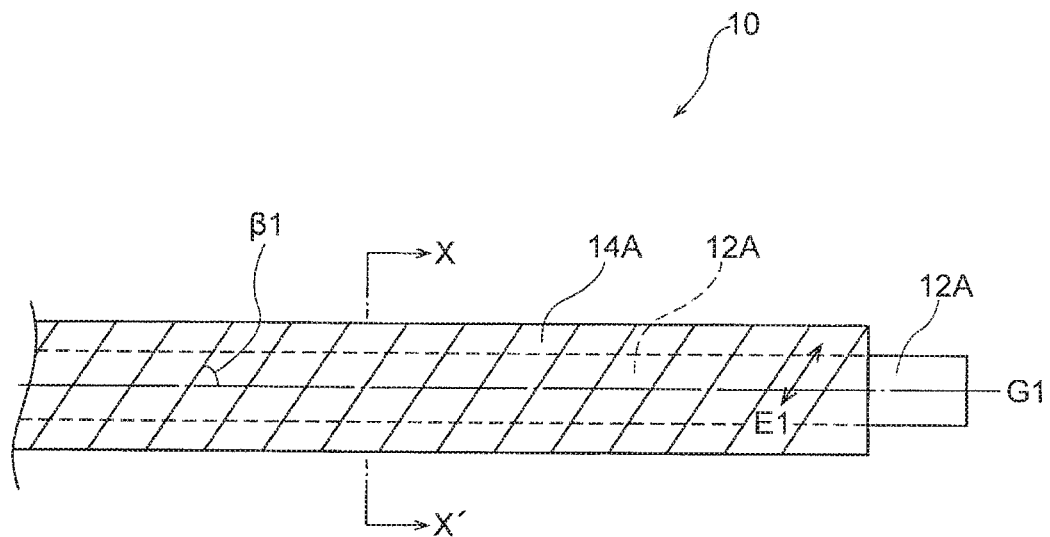
FIG. 2A is a side view illustrating a specific aspect A of a piezoelectric substrate according to the first embodiment.
Figure 2B:
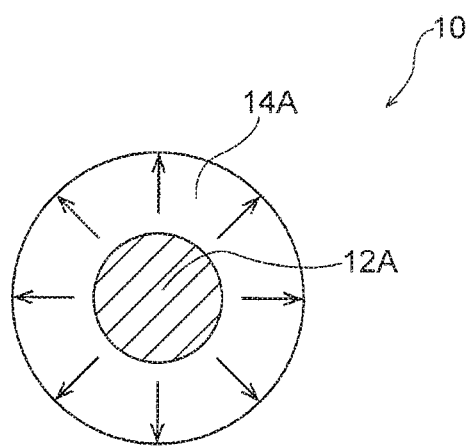
FIG. 2B is a cross-section taken along line X-X' of FIG. 2A.

FIG. 2A is a side view illustrating the specific aspect A of the piezoelectric substrate according to the first embodiment. FIG. 2B is a cross-section taken along the line X-X' of FIG. 2A.

A piezoelectric substrate 10 of the specific aspect A includes an elongate inner conductor 12A as the conductor, an elongate first piezoelectric material 14A, and an adhesive layer (not illustrated) interposed between the inner conductor 12A and the first piezoelectric material 14A.

As illustrated in FIG. 2A, the first piezoelectric material 14A is helically wound at a helix angle β1 around the outer peripheral surface of the inner conductor 12A in one direction from one end to the other end thereof so that there is no gap present therebetween.

"Helix angle β1" means an angle formed between an axial direction G1 of the inner conductor 12A and the arrangement direction of the first piezoelectric material 14A with respect to the axial direction of the inner conductor 12A.

In the specific aspect A, the first piezoelectric material 14A is wound in a left-handed manner around the inner conductor 12A. Specifically, the first piezoelectric material 14A is wound in a left-handed manner from the near side to the far side of the inner conductor 12A when the piezoelectric substrate 10 is viewed from one axial direction end of the inner conductor 12A (at the right end side in FIG. 2A).

In FIG. 2A, the principal orientation direction of the helical chiral polymer (A) included in the first piezoelectric material 14A is indicated by the double-headed arrow E1. In other words, the principal orientation direction of the helical chiral polymer (A) and the arrangement direction of the first piezoelectric material 14A (the lengthwise direction of the first piezoelectric material 14A) are substantially parallel to each other.

The adhesive layer (not illustrated) is interposed between the inner conductor 12A and the first piezoelectric material 14A. The piezoelectric substrate 10 of the specific aspect A is thereby configured so that the relative position of the first piezoelectric material 14A and the inner conductor 12A does not shift even when tension is applied to the piezoelectric substrate 10 in the lengthwise direction thereof.

The operation and advantageous effects of the piezoelectric substrate 10 of the specific aspect A will be described below.

For example, when tension is applied to the piezoelectric substrate 10 in the lengthwise direction thereof, a shear force is applied to the helical chiral polymer (A) included in the first piezoelectric material 14A, thereby polarizing the helical chiral polymer (A). The polarization of the helical chiral polymer (A) is thought to occur along the radial directions of the piezoelectric substrate 10, as indicated by the arrows in FIG. 2B, with the polarization occurring in-phase with each other. As a result, a voltage signal proportional to the tension is effectively detected.

Furthermore, in the piezoelectric substrate 10 of the specific aspect A, tension is more readily applied to the first piezoelectric material 14A due to the adhesive layer being interposed between the inner conductor 12A and the first piezoelectric material 14A.

Due to the above configuration, the piezoelectric substrate 10 of the specific aspect A is excellent in piezoelectric sensitivity and is excellent in piezoelectric output stability.

A specific aspect B of the piezoelectric substrate according to the first embodiment will now be described, with reference to the drawings. In the following description, configuration the same as the specific aspect A is appended with the same reference signs, and duplicate description is omitted thereof.

(Specific Aspect B)

Figure 3:
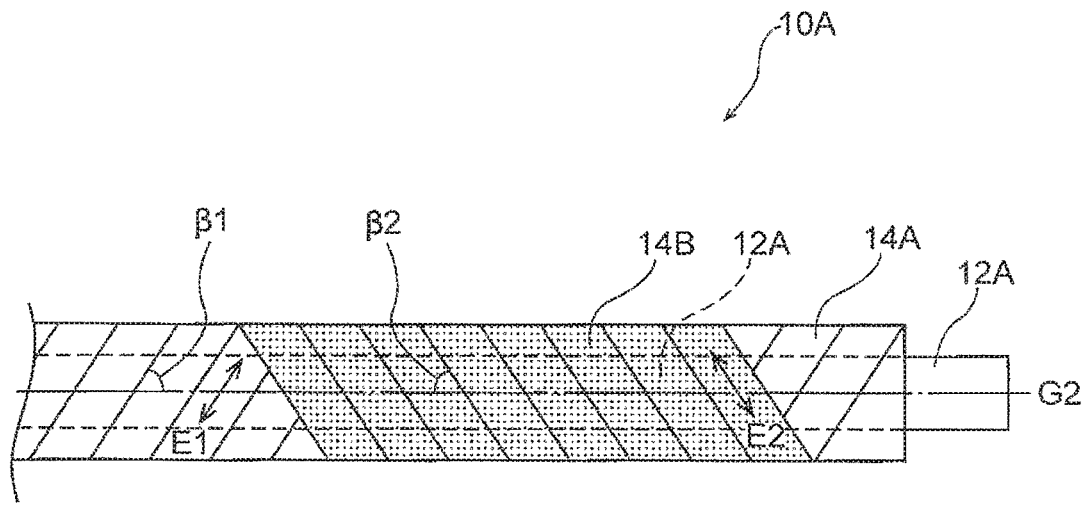
FIG. 3 is a side view illustrating a specific aspect B of the piezoelectric substrate according to the first embodiment.

FIG. 3 is a side view illustrating the specific aspect B of the piezoelectric substrate according to the first embodiment.

A piezoelectric substrate 10A of the specific aspect B differs from the piezoelectric substrate 10 of the first aspect in including an elongate second piezoelectric material 14B.

The chirality of the helical chiral polymer (A) included in the first piezoelectric material 14A and the chirality of a helical chiral polymer (A) included in the second piezoelectric material 14B differ from each other.

Similarly to in the specific aspect A, the first piezoelectric material 14A is helically wound at a helix angle β1 around the outer peripheral surface of the inner conductor 12A in one direction from one end to the other end so that there are no gaps present therebetween.

However, the second piezoelectric material 14B is helically wound in the reverse direction to the direction of winding the first piezoelectric material 14A at a helix angle β2, which is substantially the same angle as the helix angle β1, around the outer peripheral surface of the first piezoelectric material 14A, as illustrated in FIG. 3.

"Helix angle β2" is defined in a similar manner to the helix angle β1 described above.

The "reverse direction to the direction of winding of the first piezoelectric material 14A" in the specific aspect B refers here to being right-handed. In other words, the second piezoelectric material 14B is wound in a right-handed manner from the near side to the far side of the inner conductor 12A when the piezoelectric substrate 10A is viewed from one end in an axial direction G2 of the inner conductor 12A (at the right end side in FIG. 3).

In FIG. 3, the principal orientation direction of the helical chiral polymer (A) included in the second piezoelectric material 14B is indicated by the double-headed arrow E2. In other words, the principal orientation direction of the helical chiral polymer (A) included in the second piezoelectric material 14B and the arrangement direction of the second piezoelectric material 14B (the lengthwise direction of the second piezoelectric material 14B) are substantially parallel to each other.

The operation of the piezoelectric substrate 10A of the specific aspect B will be described below.

For example, when tension is applied to the piezoelectric substrate 10A in the lengthwise direction thereof, a shear stress is applied to both the helical chiral polymer (A) included in the first piezoelectric material 14A and the helical chiral polymer (A) included in second piezoelectric material 14B, and polarization accordingly occurs therein.

Each of the polarization directions is along the radial directions of the piezoelectric substrate 10A. A voltage signal proportional to the tension is accordingly effectively detected.

Due to the above configuration, the piezoelectric substrate 10A of the specific aspect B achieves greater improvements in the piezoelectric sensitivity and piezoelectric output stability.

In particular, in cases in which the piezoelectric substrate 10A of the specific aspect B includes an outer conductor, due to the piezoelectric material including the first piezoelectric material and the second piezoelectric material formed in a double-layer structure, this enables the first piezoelectric material and the second piezoelectric material to be brought into close contact with the inner conductor and the outer conductor so as to form few voids therebetween. This facilitates efficient transmission of an electric field generated by tension to an electrode. Such a form of the piezoelectric material is accordingly well suited to achieving a sensor of higher sensitivity.

A specific aspect C of the piezoelectric substrate according to the first embodiment will now be described, with reference to the drawings. In the following description, the same reference signs are appended to the same configuration as that in the specific aspect A and the specific aspect B, and duplicate explanation thereof will be omitted.

(Specific Aspect C)

Figure 4:
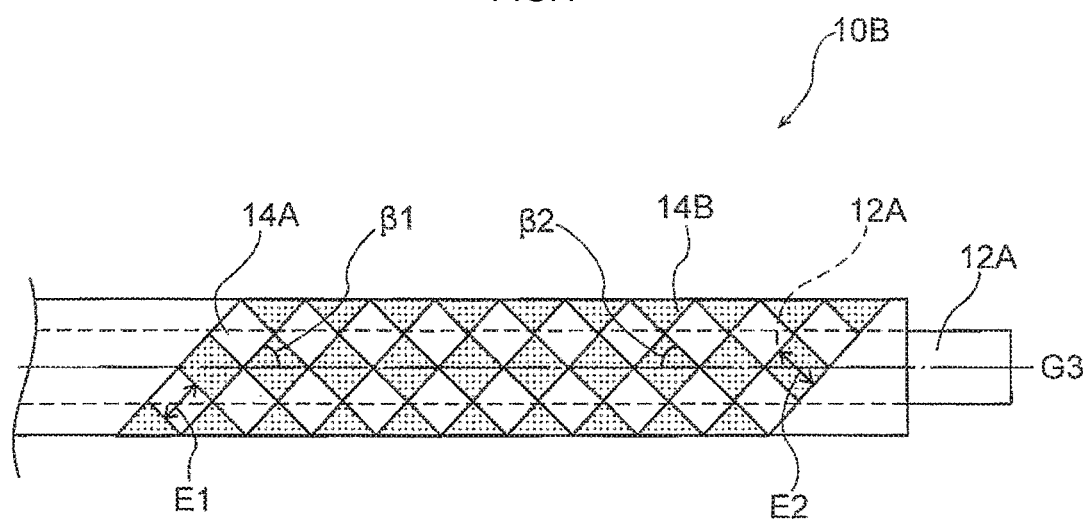
FIG. 4 is a side view illustrating a specific aspect C of the piezoelectric substrate according to the first embodiment.

FIG. 4 is a side view illustrating a specific aspect C of the piezoelectric substrate according to the first embodiment.

A piezoelectric substrate 10B of the specific aspect C differs from the piezoelectric substrate 10A of the specific aspect B in that a first piezoelectric material 14A and a second piezoelectric material 14B alternately intersect each other to form a braided structure.

The chirality of a helical chiral polymer (A) included in the first piezoelectric material 14A and the chirality of a helical chiral polymer (A) included in the second piezoelectric material 14B differ from each other.

As illustrated in FIG. 4, in the piezoelectric substrate 10B of the specific aspect C, the first piezoelectric material 14A is helically wound in a left-handed manner at a helix angle β1 with respect to an axial direction G3 of an inner conductor 12A, and the second piezoelectric material 14B is helically wound in a right-handed manner at a helix angle β2 with respect thereto. The first piezoelectric material 14A and the second piezoelectric material 14B alternately intersect each other.

In the braided structure illustrated in FIG. 4, the principal orientation direction (double-headed arrow E1) of the helical chiral polymer (A) included in first piezoelectric material 14A and the arrangement direction of the first piezoelectric material 14A are substantially parallel to each other. Similarly, the principal orientation direction (double-headed arrow E2) of the helical chiral polymer (A) included in the second piezoelectric material 14B and the arrangement direction of the second piezoelectric material 14B are substantially parallel to each other.

The operation and advantageous effects of the piezoelectric substrate 10B of the specific aspect C will be described below.

Similarly to in the specific aspect B, polarization occurs in both of the helical chiral polymer (A) included in the first piezoelectric material 14A and the helical chiral polymer (A) included in second piezoelectric material 14B when, for example, tension is applied to the piezoelectric substrate 10B in the lengthwise direction thereof. Each of the polarization directions is along the radial directions of the piezoelectric substrate 10B. As a result, a voltage signal proportional to the tension is effectively detected.

Due to the above configuration, the piezoelectric substrate 10B of the specific aspect C results achieves a greater improvement in piezoelectric sensitivity and piezoelectric output stability.

In particular, in cases in which the piezoelectric substrate 10B of the specific aspect C includes an outer conductor, when tension has been applied in the lengthwise direction of the piezoelectric substrate 10B, a shear stress is applied to the left-hand-wound first piezoelectric material and the right-hand-wound second piezoelectric material forming the braided structure. The polarization directions thereof are aligned with each other, a volume fraction contributing to the piezoelectric performance of the insulator (i.e., the first piezoelectric material and the second piezoelectric material) between the inner conductor and the outer conductor is increased, and the piezoelectric performance is therefore further improved. This thereby enables the piezoelectric substrate 10B of the specific aspect C to be suitably used, for example, as a configuration member to be conformed to a three-dimensional plane, such as in a wearable product.

The conductor, the first piezoelectric material, and the like included in the piezoelectric substrate of the present embodiment will be described below.

<Conductor>

The piezoelectric substrate of the present embodiment includes an elongate conductor.

The conductor (for example, an inner conductor) in the present embodiment is preferably a signal line conductor.

The signal line conductor refers to a conductor for efficiently detecting an electrical signal from the first piezoelectric material or the second piezoelectric material. Specifically, the signal line conductor is a conductor for detecting a voltage signal (charge signal) corresponding to tension applied when tension has been applied to the piezoelectric substrate of the present embodiment.

The conductor is preferably a good electrical conductor. Examples that may be employed as the conductor include a copper wire, an aluminum wire, an SUS wire, a metal wire coated with an insulating covering layer, a carbon fiber, a resin fiber integrated with a carbon fiber, a tinsel wire, an organic conductive material, and the like. The tinsel wire refers to a wire formed by spirally winding a copper foil around a fiber. Among such conductors, a tinsel wire and a carbon fiber are preferred from the viewpoint of improving piezoelectric sensitivity and piezoelectric output stability, and imparting high flexibility.

In particular, a tinsel wire is preferably used in an application having low electrical resistivity and requiring flexibility and pliability (for example, an application such as a wearable sensor built into clothing).

A carbon fiber is preferably used in processing applications to produce textiles or fabrics that demand very high flexibility and suppleness (for example, a piezoelectric textile, a piezoelectric fabric, or a piezoelectric sensor (a textile-form piezoelectric sensor or a fabric-form piezoelectric sensor)).

Suppleness and high flexibility are demanded in cases in which the piezoelectric substrate of the present embodiment is used as a fiber to be processed into a piezoelectric textile or a piezoelectric fabric. A yarn-form or fibrous signal line conductor is preferred in such applications. A piezoelectric substrate including a yarn-form or fibrous signal line conductor has high flexibility, and is therefore well suited to processing with a weaving machine or a knitting machine.

<First Piezoelectric Material>

The piezoelectric substrate of the present embodiment includes the elongate first piezoelectric material.

The first piezoelectric material is a piezoelectric material including an optically active helical chiral polymer (A).

(Helical Chiral Polymer (A))

The first piezoelectric material in the present embodiment includes an optically active helical chiral polymer (A).

Here, "optically active helical chiral polymer" refers to a polymer having a helical molecular structure and having molecular optical activity.

Examples of the helical chiral polymer (A) include polypeptides, cellulose derivatives, polylactic acid-based polymers, polypropylene oxide, and poly(β-hydroxybutyric acid).

Examples of the polypeptides include poly(glutaric acid γ-benzyl) and poly(glutaric acid γ-methyl).

Examples of the cellulose derivatives include cellulose acetate and cyanoethyl cellulose.

From the viewpoint of improving the piezoelectric properties of the first piezoelectric material, the helical chiral polymer (A) preferably has an optical purity of 95.00% ee or more, more preferably 96.00% ee or more, still more preferably 99.00% ee or more, and even more preferably 99.99% ee or more. The helical chiral polymer (A) desirably has an optical purity of 100.00% ee. Adopting an optical purity of the helical chiral polymer (A) in the above ranges raises the ease-of-packing of polymer crystals that exhibit piezoelectric properties, and this is thought to consequently result in improved piezoelectric properties.

The optical purity of the helical chiral polymer (A) referred to here is a value calculated by the following Formula.

Optical purity (% ee)=100×|L-form amount−D-form amount|/(L-form amount+D-form amount)

In other words, the optical purity of the helical chiral polymer (A) is a value obtained by multiplying by "100" (by obtaining the product by 100 of) "a numerical value obtained by dividing (by obtaining the quotient of) 'the difference (absolute value) between the amount (mass %) of helical chiral polymer (A) in L-form and the amount (mass %) of helical chiral polymer (A) in D-form' by 'the total amount of the amount (mass %) of helical chiral polymer (A) in L-form and the amount (mass %) of helical chiral polymer (A) in D-form'".

Values obtained by a high performance liquid chromatography (HPLC) method are employed for the amount (mass %) of helical chiral polymer (A) in L-form and the amount (mass %) of helical chiral polymer (A) in D-form. The details of specific measurement will be described later.

A polymer having a main chain including a repeating unit represented by the following Formula (1) is preferably employed as the helical chiral polymer (A) from the viewpoint of increasing the optical purity and improving the piezoelectric properties.

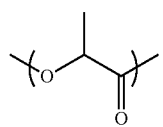

(1)

Examples of the polymer having a main chain including a repeating unit represented by the above Formula (1) include a polylactic acid-based polymer.

Polylactic acid-based polymer refers here to "polylactic acid (a polymer consisting of a repeating unit derived from a monomer selected from L-lactic acid or D-lactic acid)", "a copolymer of L-lactic acid or D-lactic acid and a compound copolymerizable with the L-lactic acid or D-lactic acid", or a mixture thereof.

Among such polylactic acid-based polymers, polylactic acid is preferred, and a homopolymer (PLLA, also simply referred to as "L-form") of L-lactic acid or a homopolymer (PDLA, also simply referred to as "D-form") of D-lactic acid is most preferred.

Polylactic acid is a polymer obtained by polymerizing lactic acid by ester bonding so as to connect together in a long polymer.

Known methods capable of producing polylactic acid include a lactide method involving lactide, a direct polymerization method in which lactic acid is heated in a solvent under reduced pressure so as to be polymerized while removing water, and the like.

Examples of the polylactic acid include a homopolymer of L-lactic acid, a homopolymer of D-lactic acid, a block copolymer including a polymer of at least one of L-lactic acid or D-lactic acid, or a graft copolymer including a polymer of at least one of L-lactic acid or D-lactic acid.

Examples of the "compound copolymerizable with L-lactic acid or D-lactic acid" include: a hydroxycarboxylic acid such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethyl caproic acid, and mandelic acid; a cyclic ester such as glycolide, β-methyl-δ-valerolactone, γ-valerolactone, and ε-caprolactone; a polycarboxylic acid such as oxalic acid, malonic acid, succinic acid, glutaric acid, adipic acid, pimelic acid, azelaic acid, sebacic acid, undecanedioic acid, dodecanedioic acid, terephthalic acid, and an anhydride thereof; a polyalcohol such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentyl glycol, tetramethylene glycol, and 1,4-hexanedimethanol; a polysaccharide such as cellulose; an aminocarboxylic acid such as α-amino acid; and the like.

Examples of the "copolymer of L-lactic acid or D-lactic acid and a compound copolymerizable with the L-lactic acid or the D-lactic acid" include a block copolymer or a graft copolymer having a polylactic acid sequence capable of forming a helical crystal.

The concentration of a copolymer component derived structure in the helical chiral polymer (A) is preferably 20 mol % or less.

For example, in cases in which the helical chiral polymer (A) is a polylactic acid-based polymer, the concentration of the copolymer component derived structure is preferably 20 mol % or less with respect to the total number of moles in the polylactic acid-based polymer of a lactic acid derived structure and a structure derived from the compound copolymerizable with lactic acid (copolymer component).

Examples of methods capable of producing the polylactic acid-based polymer include, for example: a method of obtaining the polymer by direct dehydration condensation of lactic acid, described in JP-A No. S59-096123 and JP-A No. H7-033861; a method of obtaining the polymer by ring-opening polymerization of lactide which is a cyclic dimer of lactic acid, described in U.S. Pat. Nos. 2,668,182 and 4,057,357; and the like.

Moreover, in order to achieve an optical purity of 95.00% ee or more in the polylactic acid-based polymer obtained by the above production methods, lactide having an optical purity improved by crystallization operations to an optical purity of 95.00% ee or more is preferably polymerized when, for example, a polylactic acid is produced by a lactide method.

—Weight Average Molecular Weight—

The weight average molecular weight (Mw) of the helical chiral polymer (A) is preferably from 50,000 to 1,000,000.

The mechanical strength of the first piezoelectric material is improved by making the Mw of the helical chiral polymer (A) 50,000 or more. The above Mw is preferably 100,000 or more, and is still more preferably 200,000 or more.

When obtaining the first piezoelectric material by molding (for example, extrusion molding or melt spinning), the moldability is improved by making the Mw of the helical chiral polymer (A) 1,000,000 or less. The Mw is preferably 800,000 or less, and is still more preferably 300,000 or less.

From the viewpoint of improving the strength of the first piezoelectric material, the molecular weight distribution (Mw/Mn) of the helical chiral polymer (A) is preferably from 1.1 to 5, and more preferably from 1.2 to 4. From 1.4 to 3 is still more preferable therefor.

The weight average molecular weight (Mw) and the molecular weight distribution (Mw/Mn) of the helical chiral polymer (A) refer to values measured using a gel permeation chromatograph (GPC). Mn here is the number-average molecular weight of the helical chiral polymer (A).

An example of a method of measuring Mw and Mw/Mn of the helical chiral polymer (A) using GPC will be described below.

—GPC Measurement Apparatus—

GPC-100, manufactured by Waters Corp.

—Column—

SHODEX LF-804, manufactured by Showa Denko K.K.

—Preparation of Sample—

The first piezoelectric material is dissolved in a solvent (for example, chloroform) at 40° C. to prepare a sample solution having a concentration of 1 mg/mL.

—Measurement Conditions—

0.1 mL of the sample solution is introduced into a column at a temperature of 40° C. and a flow rate of 1 mL/min using chloroform as a solvent.

The concentration of the sample in the sample solution separated by the column is measured by a differential refractometer.

A universal calibration curve is established based on a polystyrene standard sample, and the weight average molecular weight (Mw) and the molecular weight distribution (Mw/Mn) of the helical chiral polymer (A) are calculated.

A commercially available polylactic acid may be used as the polylactic acid-based polymer, serving as an example of the helical chiral polymer (A).

Examples of the commercially available product include PURASORB (PD, PL) manufactured by PURAC Inc., LACEA (H-100, H-400) manufactured by Mitsui Chemical Inc., and INGEO™ BIOPOLYMER manufactured by NatureWorks LLC.

In cases in which a polylactic acid-based polymer is used as the helical chiral polymer (A), the polylactic acid-based polymer is preferably produced by a lactide method or a direct polymerization method in order to achieve a weight average molecular weight (Mw) of the polylactic acid-based polymer of 50,000 or more.

The first piezoelectric material in the present embodiment may contain one kind of such a helical chiral polymer (A) as described above alone, or may contain two or more kinds thereof.

The content of the helical chiral polymer (A) in the first piezoelectric material in the present embodiment (total content when two or more kinds thereof) is preferably 80% by mass or more with respect to the total amount of the first piezoelectric material.

<Stabilizer>

The first piezoelectric material preferably further includes a stabilizer (B) having in one molecule one or more kinds of functional group selected from the group consisting of a carbodiimide group, an epoxy group, and an isocyanate group, and having a weight average molecular weight of from 200 to 60,000. This enables a moist heat resistance thereof to be further improved.

"Stabilizer (B)" described in the paragraphs 0039 to 0055 of WO 2013/054918 may be used as the stabilizer (B).

Examples of compounds including a carbodiimide group in one molecule (carbodiimide compound) that may be used as the stabilizer (B) include a monocarbodiimide compound, a polycarbodiimide compound, and a cyclic carbodiimide compound.

Preferred examples of the monocarbodiimide compound include dicyclohexylcarbodiimide and bis-2,6-diisopropylphenylcarbodiimide.

Polycarbodiimide compounds produced by various methods may be used as such polycarbodiimide compounds. Polycarbodiimide compounds produced by conventional methods for producing polycarbodiimides (for example as described in U.S. Pat. No. 2,941,956, Japanese Patent Publication (JP-B) No. S47-33279, and J. Org. Chem. 28, pp 2069-2075 (1963), Chemical Review 1981, Vol. 81 No. 4, pp 619-621) may be used therefor. Specifically, a carbodiimide compound described in Japanese Patent No. 4084953 may also be used therefor.

Examples of the polycarbodiimide compound include poly(4,4'-dicyclohexylmethanecarbodiimide), poly(N,N'-di-2,6-diisopropylphenylcarbodiimide), and poly(1,3,5-triisopropylphenylene-2,4-carbodiimide).

The cyclic carbodiimide compound can be synthesized by following, for example, a method described in JP-A No. 2011-256337.

A commercially available product may be used as the carbodiimide compound. Examples thereof include B2756 (trade name) manufactured by Tokyo Chemical Industry Co., Ltd., CARBODILITE LA-1 (trade name) manufactured by Nisshinbo Chemical Inc., and STABAXOL P, STABAXOL P400, and STABAXOL I (each being a trade name) manufactured by Rhein Chemie Rheinau Gmbh.

Examples of a compound (isocyanate compound) that may be used as the stabilizer (B) and includes an isocyanate group in one molecule include 3-(triethoxysilyl)propyl isocyanate, 2,4-tolylene diisocyanate, 2,6-tolylene diisocyanate, m-phenylene diisocyanate, p-phenylene diisocyanate, 4,4'-diphenylmethane diisocyanate, 2,4'-diphenylmethane diisocyanate, 2,2'-diphenylmethane diisocyanate, xylylene diisocyanate, hydrogenated xylylene diisocyanate, and isophorone diisocyanate.

Examples of a compound (epoxy compound) that may be used as the stabilizer (B) and includes an epoxy group in one molecule include phenylglycidyl ether, diethylene glycol diglycidyl ether, bisphenol-A-diglycidyl ether, hydrogenated bisphenol-A-diglycidyl ether, phenol novolac type epoxy resin, cresol novolac type epoxy resin, and epoxidized polybutadiene.

The weight average molecular weight of the stabilizer (B) is from 200 to 60,000 as described above, is more preferably from 200 to 30,000, and is still more preferably from 300 to 18,000.

Achieving a molecular weight within the above range results in the stabilizer (B) moving more easily, and in a moist heat resistance improvement effect being more effectively exhibited.

The weight average molecular weight of the stabilizer (B) is particularly preferably from 200 to 900. Note that a weight average molecular weight being from 200 to 900 is substantially the same as a number-average molecular weight being from 200 to 900. When the weight average molecular weight is from 200 to 900, the molecular weight distribution thereof is sometimes 1.0. A "weight average molecular weight of from 200 to 900" may also simply be referred to as a "molecular weight of from 200 to 900" in such cases.

In cases in which the first piezoelectric material contains the stabilizer (B), the first piezoelectric material may contain one kind of a stabilizer alone, or may contain two or more kinds thereof.

In cases in which the first piezoelectric material includes the stabilizer (B), the content of the stabilizer (B) is preferably from 0.01 parts by mass to 10 parts by mass, more preferably from 0.01 parts by mass to 5 parts by mass, still more preferably from 0.1 parts by mass to 3 parts by mass, and particularly preferably from 0.5 parts by mass to 2 parts by mass, with respect to 100 parts by mass of the helical chiral polymer (A).

Achieving a content as described above of 0.01 parts by mass or more results in a further improvement in moist heat resistance.

Achieving a content as described above of 10 parts by mass or less results in a deterioration of transparency being further suppressed.

An example of a preferred aspect of the stabilizer (B) includes an aspect in which a stabilizer (B1) including one or more kinds of functional group selected from the group consisting of a carbodiimide group, an epoxy group, and an isocyanate group and having a number-average molecular weight of from 200 to 900, is combined with a stabilizer (B2) including two or more functional groups in a molecule that are one or more kinds of functional group selected from the group consisting of a carbodiimide group, an epoxy group, and an isocyanate group and having a weight average molecular weight of from 1000 to 60,000. The weight average molecular weight of the stabilizer (B1) having a number-average molecular weight of from 200 to 900 is approximately from 200 to 900. The number-average molecular weight and the weight average molecular weight of the stabilizer (B1) are values which are substantially the same as each other.

In cases in which the stabilizer (B1) and the stabilizer (B2) are employed in combination as the stabilizer, a larger amount of stabilizer (B1) is preferably included therein from the viewpoint of improving transparency.

Specifically, with respect to 100 parts by mass of the stabilizer (B1), the amount of stabilizer (B2) is preferably in a range of from 10 parts by mass to 150 parts by mass from the viewpoint of achieving both transparency and moist heat resistance, and is more preferably in a range of from 50 parts by mass to 100 parts by mass.

Specific examples (stabilizers B-1 to B-3) of the stabilizer (B) are described below.

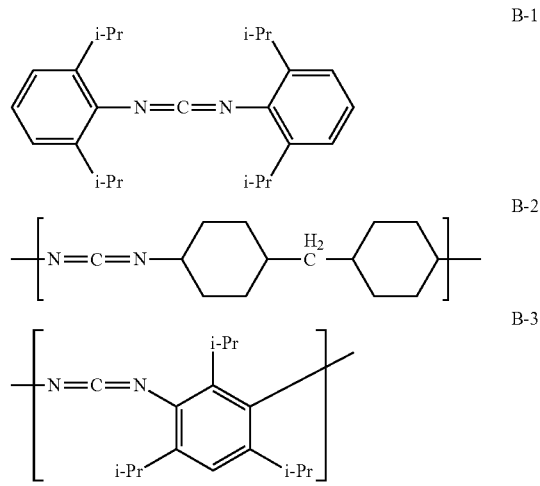

Compound names, commercially available products, and the like for the stabilizers B-1 to B-3 will be described below.

Stabilizer B-1: The compound name thereof is bis-2,6-diisopropylphenylcarbodiimide. The weight average molecular weight thereof (which is simply equivalent to "molecular weight" in this example) is 363. Examples of the commercially available products thereof include "STABAXOL I" manufactured by Rhein Chemie Rheinau Gmbh, and "B2756" manufactured by Tokyo Chemical Industry Co., Ltd.

Stabilizer B-2: The compound name thereof is poly(4,4'-dicyclohexylmethanecarbodiimide). Examples of the commercially available products thereof include "CARBODILITE LA-1" manufactured by Nisshinbo Chemical Inc., as a product having a weight average molecular weight of about 2000.

Stabilizer B-3: The compound name thereof is poly(1,3,5-triisopropylphenylene-2,4-carbodiimide). Examples of the commercially available products thereof include "STABAXOL P" manufactured by Rhein Chemie Rheinau Gmbh, as a product having a weight average molecular weight of about 3000. There is also "STABAXOL P400" manufactured by Rhein Chemie Rheinau Gmbh, as a product having a weight average molecular weight of 20,000.

<Other Components>

The first piezoelectric material may include another component, if necessary.

Examples of such other components include: known resins such as polyvinylidene fluoride, a polyethylene resin, and a polystyrene resin; known inorganic fillers such as silica, hydroxyapatite, and montmorillonite; known crystal nucleating agents such as phthalocyanine; and stabilizers other than the stabilizer (B).

Examples of such inorganic fillers and crystal nucleating agents include components described in the paragraphs 0057 to 0058 of WO 2013/054918.

(Degree of Orientation F)

The degree of orientation F of the first piezoelectric material in the present embodiment is, as described above, from 0.5 up to but not including 1.0, preferably from 0.7 up to but not including 1.0, and more preferably from 0.8 up to but not including 1.0.

Adopting a degree of orientation F of the first piezoelectric material of 0.5 or more results in a large number of molecular chains of the helical chiral polymer (A) (for example, the molecular chains of polylactic acid) being arranged in the stretching direction. This results in a high ratio of oriented crystals being generated, and enables higher piezoelectric properties to be exhibited.

Longitudinal cleavage strength is further improved when the degree of orientation F of the first piezoelectric material is less than 1.0.

(Degree of Crystallinity)

The degree of the crystallinity of the first piezoelectric material in the present embodiment is a value measured by the above X-ray diffraction measurement (wide-angle x-ray diffraction measurement).

The degree of crystallinity of the first piezoelectric material in the present embodiment is preferably from 20% to 80%, more preferably from 25% to 70%, and still more preferably from 30% to 60%.

High piezoelectric properties are maintained by adopting a degree of crystallinity of 20% or more. A high transparency is maintained in the first piezoelectric material by adopting a degree of crystallinity of 80% or less.

Adopting a degree of crystallinity of 80% or less facilitates production of the first piezoelectric material, due to whitening or breaking being less likely to occur when, for example, the first piezoelectric material is being produced by stretching a piezoelectric film that serves as raw material therefor. Adopting a degree of crystallinity of 80% or less results in a fiber with high flexibility and suppleness characteristics in cases in which, for example, production is performed by stretching a raw material for the first piezoelectric material (for example, polylactic acid) after melt spinning, thereby enabling the first piezoelectric material to be easily produced.

(Transparency (Internal Haze))

Transparency is not particularly required for the first piezoelectric material in the present embodiment, but the first piezoelectric material may, of course, have transparency.

The transparency of the first piezoelectric material can be evaluated by measuring an internal haze. The internal haze of the first piezoelectric material referred to here refers to a haze obtained by excluding haze caused by the profile of the outer surface of the first piezoelectric material.

When there are requirements for transparency, the internal haze for visible light of the first piezoelectric material is preferably 5% or less, and, from the viewpoint of further improving transparency and longitudinal cleavage strength, is more preferably 2.0% or less, and is still more preferably 1.0% or less. There is no particular lower limit value for the internal haze of the first piezoelectric material and the lower limit value may, for example, be set at 0.01%.

The internal haze of the first piezoelectric material is a value measured for a first piezoelectric material having a thickness of from 0.03 mm to 0.05 mm at 25° C. in accordance with JIS-K7105 by using a haze measuring machine (TC-HIII DPK, manufactured by Tokyo Denshoku Co., Ltd.).

An example of a method of measuring the internal haze of the first piezoelectric material will be described below.

First, a sample 1 consisting of a silicone oil (SHIN-ETSU SILICONE (trademark), product number: KF96-100CS, manufactured by Shin-Etsu Chemical Co., Ltd.) alone sandwiched between two glass sheets is prepared, and the haze (hereinafter referred to as "haze (H2)") of the sample 1 is measured in the thickness direction.

Then, a sample 2 is prepared by arranging plural strands of the first piezoelectric material uniformly coated on the surface with a silicone oil next to each other without any gaps therebetween, sandwiched between two glass sheets, and the haze (hereinafter referred to as "haze (H3)") of the sample 2 is measured in the thickness direction.

The internal haze (H1) of the first piezoelectric material is then obtained by finding the difference between the hazes as described in the following Formula.

Internal haze $(H1)$=haze $(H3)$−haze $(H2)$

The haze (H2) and the haze (H3) are each measured here using the following apparatus under the following measurement conditions.

Measurement apparatus: HAZE METER TC-HIIIDPK, manufactured by Tokyo Denshoku Co., Ltd.

Sample size: 30 mm in width×30 mm in length

Measurement conditions: based on JIS-K7105

Measurement temperature: room temperature (25° C.)

(Shape and Dimensions of First Piezoelectric Material)

The piezoelectric substrate of the present embodiment includes the elongate first piezoelectric material.

The elongate first piezoelectric material is preferably a piezoelectric material having a fiber shape (yarn-form) configured from a single or plural bundles, or a piezoelectric material having an elongate flat plate shape.

The piezoelectric material having a fiber shape (hereinafter also referred to as "fibrous piezoelectric material") and the piezoelectric material having an elongate flat plate shape (hereinafter also referred to as "elongate-flat-plate-shaped piezoelectric material") will be described in sequence below.

—Fibrous Piezoelectric Material—

Examples of the fibrous piezoelectric material include monofilament yarn and multifilament yarn.

Monofilament Yarn

The monofilament yarn preferably has a single yarn fineness of from 3 dtex to 30 dtex, and more preferably from 5 dtex to 20 dtex.

Handling the yarn is difficult in textile preparation processes and weaving processes when the single yarn fineness is less than 3 dtex. However, fusion between yarns readily occurs when the single yarn fineness is more than 30 dtex.

Cost considerations mean that monofilament yarn is preferably obtained by direct spinning and stretching. The monofilament yarn may be a procured yarn.

Multifilament Yarn

The overall fineness of multifilament yarn is preferably from 30 dtex to 600 dtex, and more preferably from 100 dtex to 400 dtex.

For example, both one-step yarns such as a spin-draw yarn, and also two-step yarns obtained by stretching such as those UDY (undrawn yarn), POY (high orientation undrawn yarn), or the like, are employable as the multifilament yarn. The multifilament yarn may be a procured yarn.

ECODEAR® PLA manufactured by Toray Industries, Inc., TERRAMAC® manufactured by Unitika Ltd., and PLASTARCH® manufactured by KURARAY CO., LTD. are employable as commercially available products of polylactic acid-based monofilament yarn and polylactic acid-based multifilament yarn.

The method of producing the fibrous piezoelectric material is not particularly limited, and any known method may be employed for production.

For example, a filament yarn (monofilament yarn or multifilament yarn) may be obtained as the first piezoelectric material by melt-spinning raw material (for example, polylactic acid) and then stretching the material (i.e. a melt-spinning stretching method). After spinning, the ambient temperature of the vicinity of the yarn is preferably maintained in a certain temperature range until cooling and solidification has occurred.

A filament yarn may be obtained as the first piezoelectric material by, for example, further separating fibers from a filament yarn obtained by the melt-spinning stretching method described above.

Cross-Sectional Profile

Various cross-sectional profiles may be employed as the cross-sectional profile of the fibrous piezoelectric material, such as a circular profile, an elliptical profile, a rectangular profile, a cocoon profile, a ribbon profile, a four-leafed profile, a star profile, and an irregular profile for cross-sections perpendicular to the longitudinal direction of the fibrous piezoelectric material.

—Elongate-Flat-Plate-Shaped Piezoelectric Material—

Examples of the elongate-flat-plate-shaped piezoelectric material include an elongate-flat-plate-shaped piezoelectric material (for example, a slit ribbon) obtained by slitting a piezoelectric film produced by a known method or a procured piezoelectric film.

Use of the elongate-flat-plate-shaped piezoelectric material as the first piezoelectric material enables close face-contact to be achieved with the conductor, thereby enabling charge generated by a piezoelectric effect to be efficiently detected as a voltage signal.

The elongate-flat-plate-shaped piezoelectric material (first piezoelectric material) in the present embodiment preferably includes a functional layer arranged on at least one principal face of the first piezoelectric material.

The functional layer may have a single-layer structure or may be a structure configured from two or more layers.

For example, in cases in which there are functional layers arranged on both principal faces of the elongate-flat-plate-shaped piezoelectric material, a functional layer arranged on the principal face on one side (hereinafter referred to as the "front face" for convenience) and a functional layer arranged on the face on the other side (hereinafter referred to as "back face" for convenience) may, independently, each have a single-layer structure or a structure configured from two or more layers.

There are various examples of functional layers that may be employed as the functional layer.

Examples of the functional layer include an adhesion-facilitation layer, a hard coat layer, a refractive index adjustment layer, an antireflection layer, an antiglare layer, a sliding-facilitation layer, an anti-blocking layer, a protective layer, an adhesive layer, an antistatic layer, a heat dissipation layer, an ultraviolet absorbing layer, an anti-Newton ring layer, a light scattering layer, a polarizing layer, a gas barrier layer, a hue adjustment layer, and an electrode layer.

The functional layer may be a layer including two or more layers from out of such layers.

The functional layer may be a layer having two or more of such functions.

In cases in which the functional layers are disposed on both principal faces of the elongate-flat-plate-shaped piezoelectric material, the functional layer arranged on the front face side and the functional layer arranged on the back face side may be the same type of functional layer or different types of functional layer.

Examples of the effects of the functional layer include the effect of filling defects such as die lines and dents in the surface of the elongate-flat-plate-shaped piezoelectric material so as to improve the appearance thereof. In such cases, the smaller the difference between the refractive indices of the elongate-flat-plate-shaped piezoelectric material and the functional layer, the more that reflection is reduced at the interface between the elongate-flat-plate-shaped piezoelectric material and the functional layer, and the greater the improvement in appearance.

The functional layer preferably includes at least one of an adhesion-facilitation layer, a hard coat layer, an antistatic layer, an anti-blocking layer, a protective layer, or an electrode layer. Adopting such an approach further facilitates application to, for example, a piezoelectric device (such as a piezoelectric textile or a piezoelectric fabric), a force sensor, an actuator, or a biodata acquisition device.

The functional layer more preferably includes an electrode layer.

The electrode layer may be provided so as to be in contact with the elongate-flat-plate-shaped piezoelectric material, or may be disposed with a functional layer other than the electrode layer interposed therebetween.

A particularly preferred aspect of the elongate-flat-plate-shaped piezoelectric material (first piezoelectric material) in the present embodiment is an aspect including functional layers provided on both principal faces of the elongate-flat-plate-shaped piezoelectric material, with both of the functional layers including an electrode layer.

In the elongate-flat-plate-shaped piezoelectric material (first piezoelectric material) in the present embodiment, at least one surface layer of a layered body including the first piezoelectric material and the functional layer is preferably an electrode layer. In other words, in the elongate-flat-plate-shaped piezoelectric material (first piezoelectric material) in the present embodiment, preferably at least one out of the surface layer on the front face side or the surface layer of the back face side is an electrode layer (i.e., the electrode layer is preferably exposed).

This thereby enables the conductor (preferably an inner conductor) or the first outer conductor to be more easily connected to the layered body in cases in which the elongate-flat-plate-shaped piezoelectric material is used as one of the configuration elements of, for example, a piezoelectric device (such as a piezoelectric textile or a piezoelectric fabric), a force sensor, an actuator, or a biodata acquisition device. This raises the ease of manufacturing the piezoelectric device (such as a piezoelectric textile or a piezoelectric fabric), the force sensor, the actuator, or the biodata acquisition device.

There is no particular limitation to the material of the functional layer, and examples thereof include: an inorganic substance such as a metal or a metal oxide; an organic substance such as a resin; a composite composition including a resin and fine particles; and the like. Examples of substances that may be employed as such a resin include a cured resin obtained by curing using heat or actinic-radiation energy. In other words, a curable resin may be used as the resin.

Examples of the curable resin include at least one material (curable resin) selected from the group consisting of an acrylic-based compound, a methacrylic-based compound, a vinyl-based compound, an allyl-based compound, a urethane-based compound, an epoxy-based compound, an epoxide-based compound, a glycidyl-based compound, an oxetane-based compound, a melamine-based compound, a cellulose-based compound, an ester-based compound, a silane-based compound, a silicone-based compound, a siloxane-based compound, a silica-acryl hybrid compound, and a silica-epoxy hybrid compound.

Among these, an acrylic-based compound, an epoxy-based compound, and a silane-based compound are more preferred.

Examples of the metal include at least one selected from Al, Si, Ti, V, Cr, Fe, Co, Ni, Cu, Zn, In, Sn, W, Ag, Au, Pd, Pt, Sb, Ta, or Zr, or an alloy thereof.

Examples of the metal oxide include titanium oxide, zirconium oxide, zinc oxide, niobium oxide, antimony oxide, tin oxide, indium oxide, cerium oxide, aluminum oxide, silicon oxide, magnesium oxide, yttrium oxide, ytterbium oxide, tantalum oxide, and at least one composite oxide thereof.

Examples of the fine particles include: fine particles of metal oxides such as those described above; resin fine particles such as fine particles of a fluorine-based resin, a silicone-based resin, a styrenic-based resin, an acrylic-based resin, and the like. Examples also include hollow fine particles configured with internal pores in such fine particles.

From the viewpoint of transparency, the average primary particle diameter of the fine particles is preferably from 1 nm to 500 nm, more preferably from 5 nm to 300 nm, and still more preferably from 10 nm to 200 nm. An average primary particle diameter of 500 nm or less results in suppression of visible light scattering, while an average primary particle diameter of 1 nm or more results in suppression of the secondary aggregation of the fine particles, this being desirable to achieve from the viewpoint of maintaining transparency.

The film thickness of the functional layer is not particularly limited, and is preferably in a range of from 0.01 μm to 10 μm.

The above upper limit value to the thickness is more preferably 6 μm or less, and still more preferably 3 μm or less. The lower limit value thereof is more preferably 0.01 μm or more, and still more preferably 0.02 μm or more.

The above thickness represents the thickness of the entire multilayer film in cases in which the functional layer is a multilayer film configured from plural functional layers. There may be a functional layer on each face of the elongate-flat-plate-shaped piezoelectric material. The refractive indices of the functional layers may be values different from each other.

There are no particular limitations to the method of producing the elongate-flat-plate-shaped piezoelectric material, and the elongate-flat-plate-shaped piezoelectric material may be produced by a known method.

For example, a method to produce a first piezoelectric material from a piezoelectric film is to mold raw material (for example, polylactic acid) into a film-form to obtain an unstretched film, to stretch and crystallize the obtained unstretched film, and then to slit the obtained piezoelectric film.

"Slitting" here means cutting the piezoelectric film is cut into an elongated shape.

Either the stretching or the crystallization may be performed first. A method may also be adopted in which the unstretched film is sequentially subjected to preliminary crystallization, then stretching, and then crystallization (annealing). Such stretching may be monoaxial stretching or biaxial stretching. In cases in which biaxial stretching is performed, a higher stretching ratio is preferably set in one direction (the principal stretching direction).

The method for producing the piezoelectric film may be performed with appropriate reference to known literature such as Japanese Patent No. 4934235, WO 2010/104196, WO 2013/054918, and WO 2013/089148.

<Second Piezoelectric Material>

The piezoelectric substrate of the first embodiment may include an elongate second piezoelectric material.

The second piezoelectric material preferably has characteristics similar to those of the first piezoelectric material.

In other words, the second piezoelectric material preferably includes an optically active helical chiral polymer (A), a lengthwise direction of the second piezoelectric material and a principal orientation direction of the helical chiral polymer (A) included in the second piezoelectric material are substantially parallel to each other, and a degree of orientation F of the second piezoelectric material, determined from X-ray diffraction measurement by the above Formula (a), is in a range of from 0.5 up to but not including 1.0.

The second piezoelectric material also preferably has characteristics similar to those of the first piezoelectric material for characteristics other than the above.

However, the winding directions of the first piezoelectric material and the second piezoelectric material, and the chiralities of the helical chiral polymers (A) included in the first piezoelectric material and the second piezoelectric material may be appropriately selected according to the aspect of the piezoelectric substrate from the viewpoint of better exhibiting the effects of the present embodiment.

Examples of preferred combinations of the winding directions of the first piezoelectric material and the second piezoelectric material and the chiralities of the helical chiral polymers (A) included in the first piezoelectric material and the second piezoelectric material are as described above in the specific aspects.

The second piezoelectric material may have characteristics different from those of the first piezoelectric material.

<First Insulator>

The piezoelectric substrate of the first embodiment may further include a first insulator.

The first insulator is preferably helically wound around the outer peripheral surface of the inner conductor.

In such cases, the first insulator may be arranged at the opposite side from the inner conductor as viewed from the first piezoelectric material, or may be interposed between the inner conductor and the first piezoelectric material.

The winding direction of the first insulator may be the same direction as the winding direction of the first piezoelectric material or a different direction therefrom.

This is advantages particularly in cases in which the piezoelectric substrate of the first embodiment includes a first outer conductor, since further including the first insulator in the piezoelectric substrate according to the first embodiment makes it easier to suppress the occurrence of an electrical short circuit between the inner conductor and the outer conductor when the piezoelectric substrate undergoes bending deformation.

The first insulator is not particularly limited, and examples thereof include a vinyl chloride resin, a polyethylene resin, a polypropylene resin, an ethylene-tetrafluoroethylene copolymer (ETFE), a tetrafluoroethylene-hexafluoropropylene copolymer (FEP), a tetrafluoroethylene resin (PTFE), a tetrafluoroethylene-perfluoropropylvinylether copolymer (PFA), a fluororubber, a polyester resin, a polyimide resin, a polyamide resin, a polyethylene terephthalate resin (PET), and a rubber (including an elastomer).

The shape of the first insulator is preferably an elongate shape from the viewpoint of winding around the conductor.

<Second Insulator>

The piezoelectric substrate of the present embodiment may, in cases in which a first outer conductor is provided at an outer periphery thereof, further include a second insulator provided at the outer periphery of the first outer conductor.

Adopting such an approach enables the inner conductor configuring the signal line to be electrostatically shielded, and suppresses voltage fluctuations in the conductor (preferably an inner conductor) due to the effects of external static electricity.

The second insulator is not particularly limited, and examples thereof include the materials described in the examples of the first insulator.

The shape of the second insulator is not particularly limited, and any shape capable of covering at least a portion of the first outer conductor may be adopted therefor.

(First Outer Conductor)

The piezoelectric substrate of the present embodiment preferably further includes a first outer conductor at an outer periphery.

The first outer conductor in the present embodiment is preferably a ground conductor.

The ground conductor refers to, for example, a conductor paired with the conductor (preferably a signal line conductor) when a signal is being detected.

The material of the ground conductor is not particularly limited, and main examples thereof include the following materials according to the cross-sectional profile thereof.

For example, materials that may be used as the material of a ground conductor having a rectangular cross-section include a copper foil ribbon obtained by rolling a copper wire of a circular cross-section so as to process the copper wire into a flat plate shape, an Al foil ribbon, and the like.

For example, materials that may be used as the material of a ground conductor having a circular cross-section include a copper wire, an aluminum wire, an SUS wire, a metal wire covered with an insulating layer, a carbon fiber, a resin fiber integrated together with a carbon fiber, and a tinsel wire obtained by spirally winding a copper foil around a fiber.

A material obtained by coating an organic conductive material with an insulating material may be used as the material of the ground conductor.

The ground conductor is preferably arranged to wrap around the conductor (preferably a signal line conductor) and the first piezoelectric material so as to avoid short circuiting with the signal line conductor.

A method of wrapping such a signal line conductor may be a wrapping method selected from a method of helically winding a copper foil or the like, a method of making a copper wire or the like into a cylindrical braid and then wrapping such a signal line conductor therein, or the like.

The method of wrapping the signal line conductor is not limited to these methods. Wrapping the signal line conductor enables electrostatic shielding to be performed, and enables voltage fluctuations in the signal line conductor due to the effects of external static electricity to be prevented.

A preferable aspect is also an arrangement of the ground conductor so as to be arranged by wrapping in a cylindrical shape so as to enclose a minimum basic configuration unit (i.e., the conductor and the first piezoelectric material) of the piezoelectric substrate of the present embodiment.

Various cross-sectional profiles may be employed as the cross-sectional profile of the ground conductor, such as a circular profile, an elliptical profile, a rectangular profile, and an irregular profile. In particular, a rectangular cross-section enables close contact to be achieved by flat-faces with the conductor (preferably a signal line conductor), the first piezoelectric material, and, according to circumstances, with the first insulator, the second piezoelectric material, or the like, thereby enabling charge generated by a piezoelectric effect to be efficiently detected as a voltage signal.

<Adhesive Agent to Form Adhesive Layer>

The piezoelectric substrate of the present embodiment preferably includes an adhesive layer between the conductor and the first piezoelectric material.

The adhesive agent to form the adhesive layer is used in order to mechanically integrate the conductor and the first piezoelectric material together or to maintain an inter-electrode distance (between the conductor and the outer conductor) in cases in which the piezoelectric substrate includes an outer conductor.

Providing the adhesive layer between the conductor and the first piezoelectric material inhibits the relative position of the conductor and the first piezoelectric material from shifting when tension has been applied to the piezoelectric substrate of the present embodiment, thereby facilitating application of tension to the first piezoelectric material. This accordingly enables a voltage output proportional to the tension to be effectively detected from the conductor (preferably a signal line conductor). As a result, piezoelectric sensitivity and piezoelectric output stability are further improved. Providing the adhesive layer results in a further increase in the absolute value of the amount of generated charge per unit tensile force.

However, since suppleness is maintained after processing a piezoelectric substrate lacking an adhesive layer between a conductor and a first piezoelectric material into a piezoelectric fiber, this approach results in a favorable feeling of fit when employed in a wearable sensor or the like.

The following materials may be used as the material of the adhesive agent to form the adhesive layer.

Examples of adhesive agents that may be used therefor include an epoxy-based adhesive agent, a urethane-based adhesive agent, a vinyl acetate resin-based emulsion type adhesive agent, an (EVA)-based emulsion type adhesive agent, an acrylic resin-based emulsion type adhesive agent, a styrene-butadiene rubber-based latex type adhesive agent, a silicone resin-based adhesive agent, an α-olefin (isobutene-maleic anhydride resin)-based adhesive agent, a vinyl chloride resin-based solvent type adhesive agent, a rubber-based adhesive agent, an elastic adhesive agent, a chloroprene rubber-based solvent type adhesive agent, a nitrile rubber-based solvent type adhesive agent or the like, and a cyanoacrylate-based adhesive agent or the like.

—Elastic Modulus—

The adhesive agent in the present embodiment preferably has an elastic modulus after bonding that is either equivalent to, or greater than, that of the first piezoelectric material. If the material used has an elastic modulus lower than the elastic modulus of the first piezoelectric material, then strain (piezoelectric strain) caused by tension that has been applied to the piezoelectric substrate of the present embodiment would be attenuated by the adhesive agent portion, decreasing the transfer efficiency of strain to the first piezoelectric material. This results in the sensitivity of a sensor being prone to decrease in cases in which the piezoelectric substrate of the present embodiment is applied to a sensor, for example.

—Thickness—

The thickness at sites bonded by the adhesive agent in the present embodiment is preferably as thin as possible within a range in which there are no voids between the bonding targets and bonding strength does not decrease. Decreasing the thickness at the bonded sites makes it less likely that strain caused by tension that has been applied to the piezoelectric substrate is attenuated by the adhesive agent portion, and the strain on the first piezoelectric material is efficiently decreased. This results in the sensitivity of a sensor being improved in cases in which the piezoelectric substrate of the present embodiment is applied to a sensor, for example.

—Method of Applying Adhesive Agent—

The method of applying the adhesive agent is not particularly limited, and the following two methods are primarily used therefor.

Method of Interposing Adhesive Agent and Performing Bonding after Processing

Examples thereof include a method in which: a conductor (preferably a signal line conductor) and a first piezoelectric material are arranged; the signal line conductor and a ground conductor are processed and arranged; and then, after this has been completed, an adhesive agent is interposed and adhered at an interface between the conductor and the first piezoelectric material by a method such as dip coating, impregnation, or the like.

In the above method, as well as bonding the conductor and the first piezoelectric material to each other, bonding may also be performed between each member that has, if necessary, been included in the piezoelectric substrate of the present embodiment.

Method of Interposing Uncured Adhesive Agent Before Processing, and Performing Bonding after Processing Examples thereof include a method in which a photo-curable adhesive agent, a thermosetting adhesive agent, a thermoplastic adhesive agent, or the like is coated in advance onto a surface of a first piezoelectric material using a gravure coater, a dip coater, or the like, and then dried. Then after completing arrangement of a conductor and the first piezoelectric material, the adhesive agent is then cured by ultraviolet irradiation or heat so as to bond an interface between the conductor and the first piezoelectric material.

In the above method, as well as bonding the conductor and the first piezoelectric material to each other, bonding may also be performed between each member that has, if necessary, been included in the piezoelectric substrate of the present embodiment.

Using the above method enables processing to be performed by dry processes, after the adhesive agent has been coated and dried, thereby facilitating processing or facilitating formation of a uniform film thickness. This results in characteristically small variations in sensor sensitivity and the like.

<Method of Producing Piezoelectric Substrate>

The method of producing the piezoelectric substrate of the present embodiment is not particularly limited, and the piezoelectric substrate may be produced, for example, by preparing a first piezoelectric material and helically winding the first piezoelectric material around a separately prepared conductor (preferably a signal line conductor) in one direction.

The first piezoelectric material may also be produced by a known method and may also be procured.

In cases in which the piezoelectric substrate of the present embodiment includes, if necessary, a second piezoelectric material and a first insulator, such a piezoelectric substrate may be produced in accordance with the methods for helically winding the first piezoelectric material.

However, the directions of winding the first piezoelectric material and the second piezoelectric material, and the chiralities of the helical chiral polymers (A) included in the first piezoelectric material and the second piezoelectric material, are preferably selected in accordance with the aspects of the piezoelectric substrate described above.

In cases in which the piezoelectric substrate of the present embodiment includes a first outer conductor (for example, a ground conductor), such a piezoelectric substrate may be produced by arranging the first outer conductor using the above methods or a known method.

If necessary, the conductor and the first piezoelectric material, and each member included in the piezoelectric substrate of the present embodiment, may be stuck together by interposing an adhesive agent therebetween using, for example, the method described above.

In the piezoelectric substrate of the present embodiment, due to the application of tensile force, shearing strain proportional to the tensile force is applied to a helical chiral (A) and detected as a voltage signal (charge signal) from the conductor.

Second Embodiment

A sensor module 200 of a second embodiment is described below, with reference to FIG. 5A to FIG. 5C.

An attachment structure 100 in the second embodiment is the same at that of the first embodiment, however, a press section 20A and a base section 20B configuring the sensor module 200 differ therefrom in that an integrated configuration is adopted therefor.

The structure of a piezoelectric substrate 10 is the same as that of the first embodiment and so description thereof will be omitted. The same reference signs are appended to the same configuration as that of the first embodiment.

Figure 5A:
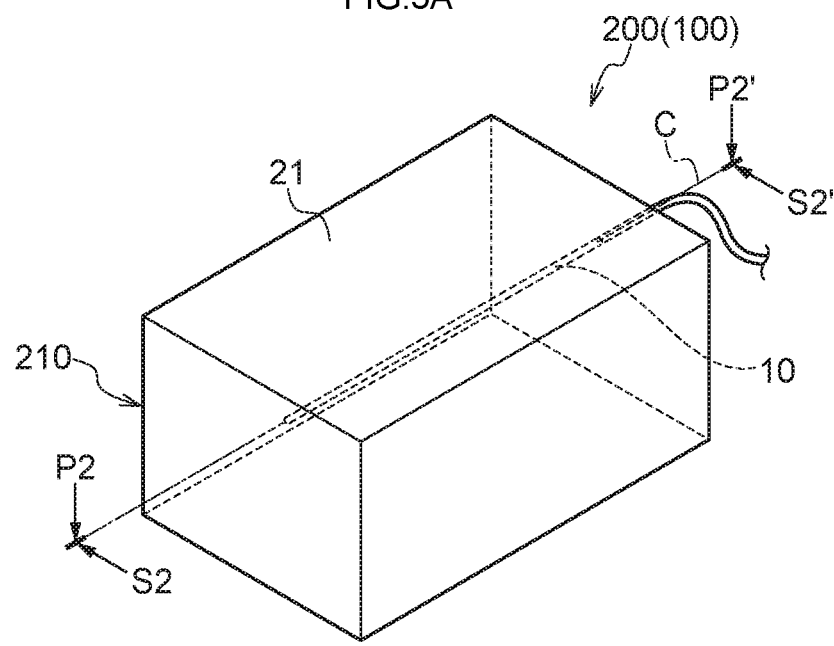
FIG. 5A is a perspective view of a sensor module according to a second embodiment.
Figure 5B:
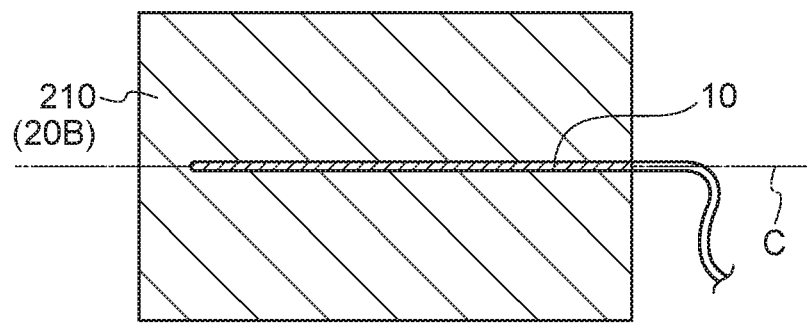
FIG. 5B is a plan view cross-section of the sensor module of the second embodiment.
Figure 5C:
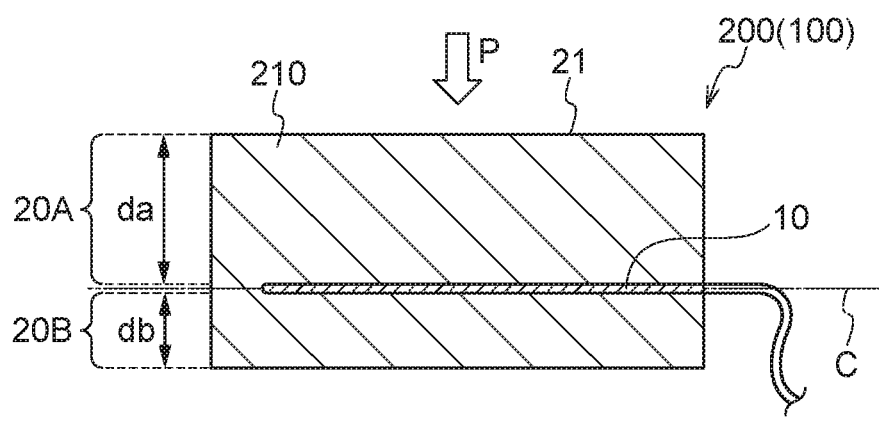
FIG. 5C is a side view cross-section of the sensor module of the second embodiment.

FIG. 5A to FIG. 5C illustrate the sensor module 200 equipped with the attachment structure 100 of the present embodiment. In the present embodiment, a main body 210 is configured by the press section 20A pressed by contact, and the base section 20B provided adjacent to the piezoelectric substrate 10 on the opposite side from the press section 20A, with the press section 20A and the base section 20B integrated together. In the present embodiment, the Young's modulus Ef of the press section 20A and the base section 20B (i.e. of the main body 210) is in a range of from $10^{-3}$ to $10^1$ GPa.

FIG. 5B is a plan view cross-section (cross-section along a plane parallel to a principal face) of the sensor module 200 sectioned along a boundary at the axis of the piezoelectric substrate 10 (straight line C), and is a cross-section taken along line P2-P2' of FIG. 5A. As illustrated in this figure, the piezoelectric substrate 10 is a cable-shaped piezoelectric substrate 10 extending in a straight line from one end to the other end in a lengthwise direction.

FIG. 5C is a side view cross-section (cross-section taken along the thickness direction) of the sensor module 200 sectioned along a boundary at the axis of the piezoelectric substrate 10 (straight line C), and is a cross-section taken along line S2-S2' of FIG. 5A. As illustrated in this figure, the sensor module 200 of the present embodiment is formed by embedding the cable-shaped piezoelectric substrate 10 in the main body 210.

In the sensor module 200 here of the present embodiment, a pressure-applied face 21 side of the boundary at the piezoelectric substrate 10 configures the press section 20A, and the opposite side thereof to the pressure-applied face 21 side configures the base section 20B.

The following materials may be employed as the main body 210.

Materials that may be employed therefor include: an organic gel; an inorganic gel; an elastomer such as a silicone elastomer, an acrylic elastomer, a urethane elastomer, a fluorine-based elastomer, a perfluoro elastomer, an isoprene rubber, a butadiene rubber, a styrene-butadiene rubber, natural rubber, a chloroprene rubber, a nitrile rubber, a butyl rubber, an ethylene propylene rubber, and an epichlorohydrin rubber; a polymer material such as polyethylene, polypropylene, polystyrene, polyvinylchloride, polyethylene terephthalate, a polycarbonate, polyamide, a polyvinyl alcohol, polyacetal, a polyimide, polyester, a cyclic polyolefin, a styrene-acrylonitrile copolymer, a styrene-butadiene-acrylonitrile copolymer, an ethylene-vinyl acetate copolymer, a methacrylic-styrene copolymer, an acrylic resin, a fluororesin, a urethane resin, a phenol resin, a urea resin, an epoxy resin, a cellulose-based resin, an unsaturated polyester resin, a melamine resin, a silicone resin, a copolymer or alloy thereof, a modified product thereof, and a foamed product (foam) thereof; a wood; and the like.

In the present embodiment, the Young's modulus Ef of the main body 210 is in the range of from $10^{-3}$ to $10^1$ GPa, this being a hardness enabling elastic deformation thereof by hand. The piezoelectric substrate 10 in the sensor module 200 of the present embodiment is accordingly readily bent.

Moreover, in the present embodiment, a thickness of the press section 20A in a direction of adjacency to the piezoelectric substrate 10 (da in FIG. 5C) is thicker than a thickness of the base section 20B in the adjacency direction (db in FIG. 5C).

Adopting the thickness relationship described above results in the following operation and advantageous effects being exhibited. First, bending is less prone to occur in the press section 20A due to the press section 20A being thicker than the base section 20B, and pressure is accordingly readily transmitted to the piezoelectric substrate 10 irrespective of the location that is pressed on the pressure-applied face 21. Moreover, bending more readily occurs in the base section 20B than in the press section 20A, and the piezoelectric substrate 10 readily bends in the pressure-application direction (arrow P direction in FIG. 5C). This accordingly enables pressure applied to the press section 20A to be detected at high sensitivity. In the present embodiment, it is sufficient to lay the piezoelectric substrate 10 in a straight line with respect to the pressure-applied face 21. The piezoelectric substrate 10 does not need to be laid over the entire surface of the pressure-applied face 21 in, for example, a wavy shape or a flat-spiral shape. Namely, the length of the piezoelectric substrate 10 can be shortened.

(Method of Producing the Sensor Module)

In order to produce the sensor module 200 of the present embodiment, there are two methods for embedding the piezoelectric substrate 10: a method in which embedding is performed during molding of the main body 210; and a method in which embedding is performed after molding of the main body 210.

First, in cases in which embedding is performed during molding of the main body 210, the main body 210 is formed so as to surround the piezoelectric substrate 10, by melt-extrusion or by injection molding. In the sensor module 200 formed in such a manner, the piezoelectric substrate 10 embedded inside the main body 210 is fixed to the main body 210. The main body 210 may also be formed by disposing a curable material so as to surround the piezoelectric substrate 10, and then curing the curable material.

Moreover, in cases in which embedding is performed after molding of the main body 210, the main body 210 is formed by opening a hole in a side face of the main body 210 after molding, and inserting the piezoelectric substrate 10 therein. Note that for post-insertion of the piezoelectric substrate 10, the piezoelectric substrate 10 is inserted after an adhesive agent has been poured into the hole for piezoelectric substrate 10 insertion. Alternatively, an adhesive agent is impregnated after the piezoelectric substrate 10 has been inserted. Using an adhesive agent enables movement of the piezoelectric substrate 10 in its axial direction to be prevented in the main body 210.

Third Embodiment

A sensor module 200 of a third embodiment will be described below, with reference to FIG. 6A to FIG. 6C.

The third embodiment is an example in which a sensor module is configured by a pressure sensitive adhesive tape 240 and a first member 220. Specifically, the sensor module 200 of the present embodiment includes the following structure. Namely, including a cable-shaped piezoelectric substrate 10, and a press section 20A provided adjacent to the piezoelectric substrate 10 and pressed from the opposite side from the piezoelectric substrate 10. In the present embodiment, a Young's modulus Ea of the press section 20A is in the range of from $10^{-3}$ to $10^1$ GPa.

The structure of the piezoelectric substrate 10 is the same as that of the first embodiment, and so description thereof is omitted. The same reference signs are appended to the same configuration as that of the first embodiment.

Figure 6A:
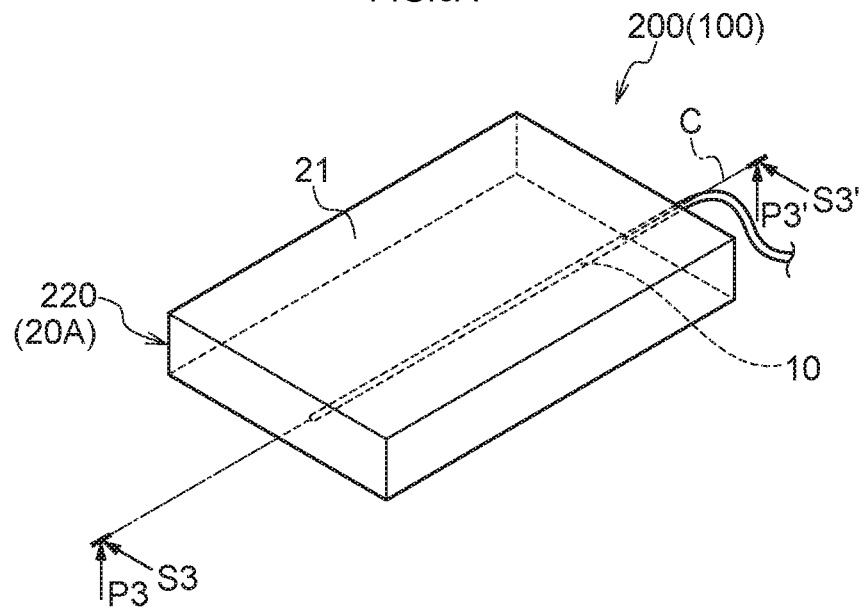
FIG. 6A is a perspective view of a sensor module of a third embodiment.

FIG. 6A is a perspective view of the sensor module 200 of the present embodiment. The sensor module 200 of the present embodiment includes a cuboidal shaped first member 220, and a piezoelectric substrate 10 that is covered by the pressure sensitive adhesive tape 240 and is disposed on the lower face of the first member 220.

Figure 6B:
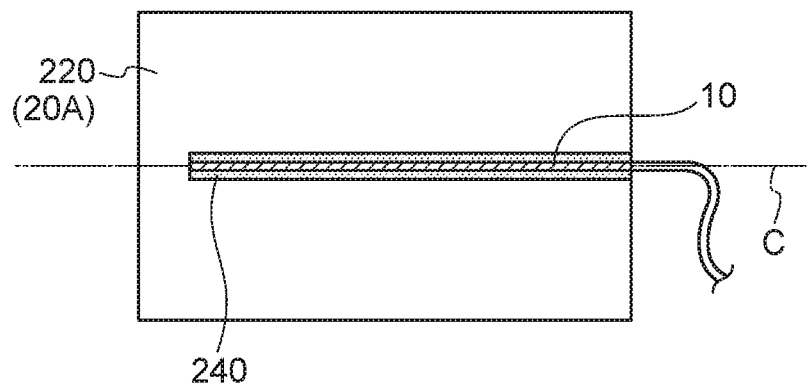
FIG. 6B is a bottom view cross-section of a sensor module of the third embodiment.

FIG. 6B is a bottom view cross-section (cross-section of a plane parallel to a principal face) of the sensor module 200 sectioned along a boundary at the axis of the piezoelectric substrate 10 (straight line C), and is a cross-section taken along line P3-P3' of FIG. 6A. As illustrated in this figure, the piezoelectric substrate 10 is a cable-shaped piezoelectric substrate 10 extending in a straight line from one end to the other end in a lengthwise direction. The pressure sensitive adhesive tape 240 is provided so as to cover a leading end portion and outer peripheral portion of the piezoelectric substrate 10.

Figure 6C:
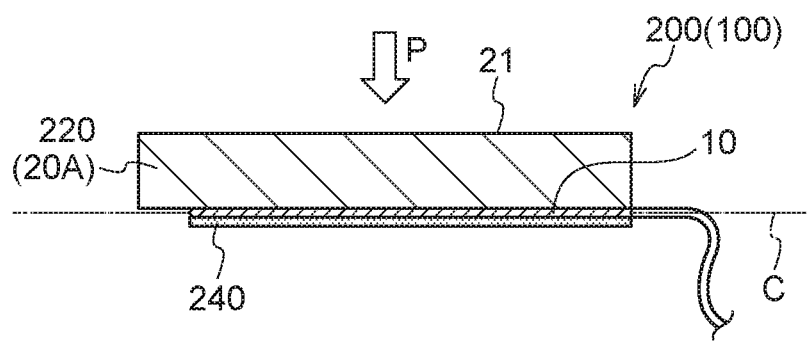
FIG. 6C is a side view cross-section of the sensor module of the third embodiment.

FIG. 6C is a side view cross-section (cross-section in the thickness direction) of the sensor module 200 sectioned along a boundary at the axis of the piezoelectric substrate 10 (straight line C), and is a cross-section taken along line S3-S3' of FIG. 6A. As illustrated in this figure, the pressure sensitive adhesive tape 240 is provided so as to cover a leading end portion and lower portion of the piezoelectric substrate 10. The pressure sensitive adhesive tape 240 is stuck to the first member 220 so as to cover the piezoelectric substrate 10.

In the present embodiment, a Young's modulus Ea of the press section 20A (i.e. of the first member 220) is in the range of from $10^{-3}$ to $10^1$ GPa, and pressure is readily transmitted to the piezoelectric substrate 10 irrespective of the pressed location on the pressure-applied face 21. Moreover, due to there being no member constricting the piezoelectric substrate 10 present on the opposite face of the piezoelectric substrate 10 to the press section 20A (i.e. the first member 220) face thereof, the piezoelectric substrate 10 readily bends in the pressure-application direction (arrow P direction in FIG. 6C). This enables pressure applied to the press section 20A to be detected at high sensitivity. In the present embodiment, it is sufficient to lay the piezoelectric substrate 10 in a straight line with respect to the pressure-applied face 21. The piezoelectric substrate 10 does not need to be laid over the entire surface of the pressure-applied face 21 in, for example, a wavy shape or a flat-spiral shape. Namely, the length of the piezoelectric substrate 10 can be shortened.

(Method of Producing the Sensor Module)

In order to produce the sensor module 200 of the present embodiment, the piezoelectric substrate 10 is first placed in a straight line along the lower face of the first member 220. The pressure sensitive adhesive tape 240 is then stuck on so as to cover the piezoelectric substrate 10.

Fourth Embodiment

A sensor module 200 of a fourth embodiment will be described below, with reference to FIG. 7A and FIG. 7B.

The fourth embodiment has the following features. Namely, includes a cable-shaped piezoelectric substrate 10, and a press section 20A provided adjacent to the piezoelectric substrate 10 and pressed from the opposite side from the piezoelectric substrate 10. A length of the piezoelectric substrate 10 adjacent to the press section 20A is different to a length of a contact portion of the piezoelectric substrate 10 in contact with the press section 20A.

Figure 7A:
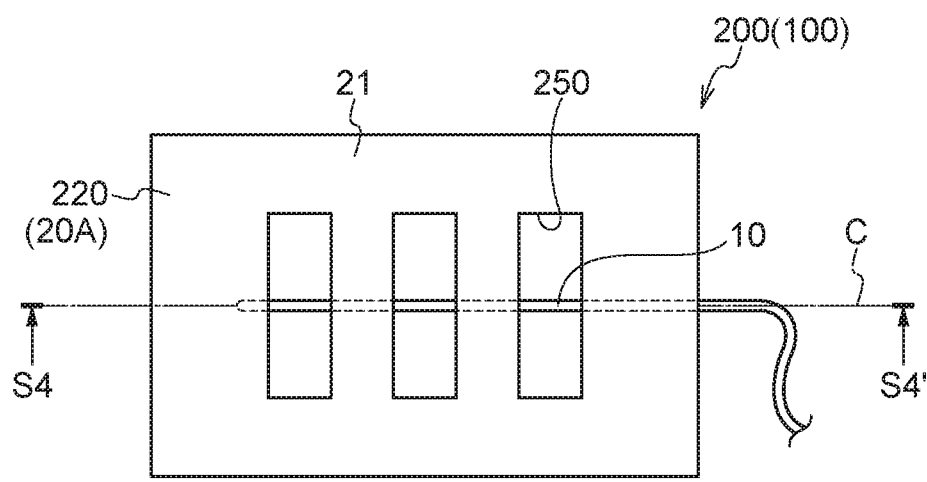
FIG. 7A is a plan view of a sensor module of a fourth embodiment.

As illustrated in FIG. 7A, the sensor module 200 of the present embodiment includes a cuboidal shaped first member 220 serving as a press section 20A, and the piezoelectric substrate 10 disposed on the lower face of the first member 220. The first member 220 has openings 250 provided at three layout locations on the piezoelectric substrate 10.

Figure 7B:
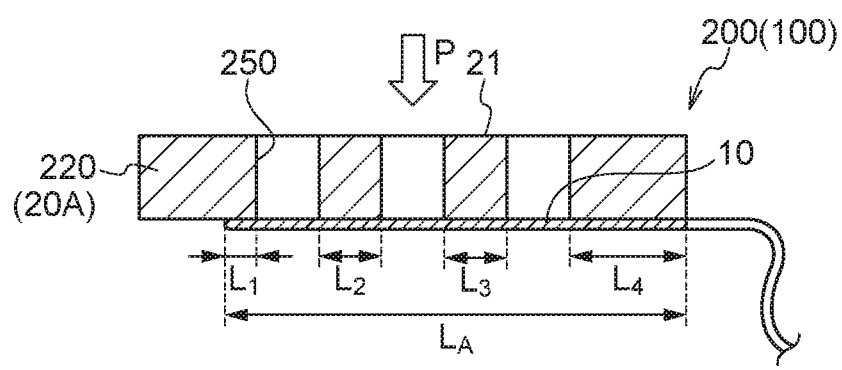
FIG. 7B is a side view cross-section of the sensor module of the fourth embodiment.

FIG. 7B is a side view cross-section (cross-section in the thickness direction) of the sensor module 200 sectioned along a boundary at the axis of the piezoelectric substrate 10 (straight line C), and is a cross-section taken along line S4-S4' of FIG. 7A. As illustrated in this figure, the piezoelectric substrate 10 is in contact with portions on the lower face of the first member 220 (i.e. faces on the opposite side from the pressure-applied face 21) except for at the openings 250. Note that although not particularly illustrated, the piezoelectric substrate 10 is fixed to the first member 220 by an adhesive member or pressure sensitive adhesive tape.

A length of the piezoelectric substrate 10 adjacent to the press section 20A (i.e. the first member 220) is denoted here as LA, the respective lengths of contact portions of the piezoelectric substrate 10 in contact with the press section 20A (i.e. the first member 220) are denoted here as L1, L2, L3, and L4, and the following relationship is satisfied.

$$LA > L1 + L2 + L3 + L4$$

The above may be restated as: the length of the piezoelectric substrate 10 adjacent to the press section 20A is different to a length of the contact portions of the piezoelectric substrate 10 in contact with the press section 20A.

In the present embodiment, at portions of the pressure-applied face 21 other than at the openings 250, pressure is readily transmitted to the piezoelectric substrate 10 irrespective of the location pressed. Moreover, due to the openings 250, there are portions unaffected by pressure on the face of the piezoelectric substrate 10 opposing the press section 20A (i.e. the first member 220), and so a shear force arises between these portions and portions on the face of the piezoelectric substrate 10 that are affected by pressure, i.e. the portions other than at the openings 250. The piezoelectric substrate 10 accordingly readily deforms. This thereby enables pressure applied to the press section 20A in the present embodiment to be detected at high sensitivity. In the present embodiment, it is sufficient to lay the piezoelectric substrate 10 in a straight line with respect to the pressure-applied face 21. The piezoelectric substrate 10 does not need to be laid over the entire surface of the pressure-applied face 21 in, for example, a wavy shape or a flat-spiral shape. Namely, the length of the piezoelectric substrate 10 can be shortened.

Note that the method of producing the sensor module 200 of the present embodiment is the same as the production method employed in the third embodiment as described above.

Fifth Embodiment

A sensor module 200 of a fifth embodiment will be described below, with reference to FIG. 8A and FIG. 8B.

The fifth embodiment has the following features. Namely, includes a cable-shaped piezoelectric substrate 10, a press section 20A provided adjacent to the piezoelectric substrate 10 and pressed from the opposite side from the piezoelectric substrate 10, and a base section 20B provided adjacent to the piezoelectric substrate 10 on the opposite side thereof to the press section 20A. A length of the piezoelectric substrate 10 adjacent to the press section 20A and the base section 20B is different from a length of contact portions of the piezoelectric substrate 10 in contact with the press section 20A and the base section 20B.

Figure 8A:
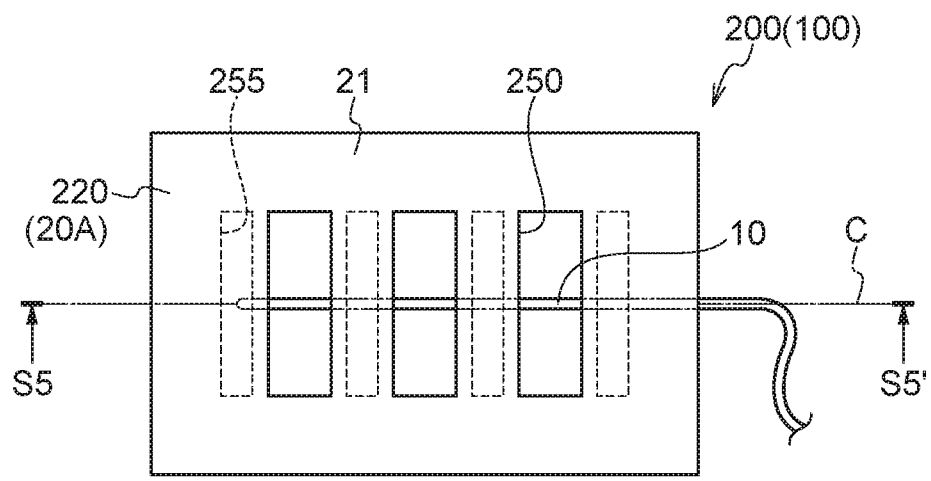
FIG. 8A is a plan view of a sensor module of a fifth embodiment.

As illustrated in FIG. 8A, the sensor module 200 of the present embodiment includes a cuboidal shaped first member 220 serving as a press section 20A, and a cuboidal shaped second member 222 serving as a base section 20B. The piezoelectric substrate 10 is disposed between the first member 220 and the second member 222. Openings 250 are provided in the first member 220 at three locations where the piezoelectric substrate 10 is laid, and openings 255 are provided in the second member 222 at four locations where the piezoelectric substrate 10 is laid.

Figure 8B:
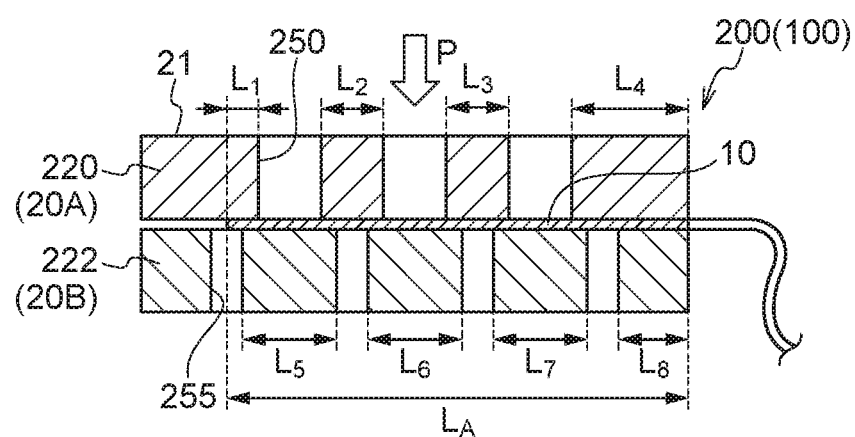
FIG. 8B is a side view cross-section of a sensor module of the fifth embodiment.

FIG. 8B is a side view cross-section (cross-section in the thickness direction) of the sensor module 200 sectioned along a boundary at the axis of the piezoelectric substrate 10 (straight line C), and is a cross-section taken along line S5-S5' of FIG. 8A. As illustrated in this figure, the piezoelectric substrate 10 is in contact with portions on the lower face of the first member 220 (i.e. faces on the opposite side from the pressure-applied face 21) except for at the openings 250, and is in contact with portions on the upper face of the second member 222 (i.e. faces on the pressure-applied face 21 side) except for at the openings 255. Note that although not particularly illustrated, the piezoelectric substrate 10 is fixed to the first member 220 and/or to the second member 222 by an adhesive member or the like. Moreover, in cases in which the piezoelectric substrate 10 is covered in a covering member having pressure sensitive self-adhesive properties, the piezoelectric substrate 10 is fixed to the first member 220 and the second member 222 by utilizing the pressure sensitive self-adhesive properties of the covering member.

A length of the piezoelectric substrate 10 adjacent to the press section 20A (i.e. the first member 220) and adjacent to the base section 20B (i.e. the second member 222) is denoted here as LA. The respective lengths of contact portions of the piezoelectric substrate 10 in contact with the press section 20A (i.e. the first member 220) are denoted as L1, L2, L3, and L4, the respective lengths of contact portions of the piezoelectric substrate 10 with the base section 20B (i.e. the second member 222) are denoted as L5, L6, L7, and L8, and the following relationship is satisfied.

$$LA < L1 + L2 + L3 + L4 + L5 + L6 + L7 + L8$$

The above may be restated as: the length of the piezoelectric substrate 10 adjacent to the press section 20A and the base section 20B is different to the length of contact portions of the piezoelectric substrate 10 in contact with the press section 20A and the base section 20B.

In the present embodiment, at portions of the pressure-applied face 21 excluding at the openings 250, pressure is readily transmitted to the piezoelectric substrate 10 irrespective of the location pressed. Moreover, due to the openings 250 there are portions not pressed on the face of the piezoelectric substrate 10 opposing the press section 20A (i.e. the first member 220). Moreover, due to the openings 255, there are portions where the piezoelectric substrate 10 is not supported on the face of the piezoelectric substrate 10 opposing the base section 20B (i.e. the second member 222). A shear force accordingly arises in the piezoelectric substrate 10 between portions that are affected by pressure, i.e. at the portions other than at the openings 250, and portions of the piezoelectric substrate 10 at the openings 255 where the piezoelectric substrate 10 is not supported. The piezoelectric substrate 10 accordingly readily deforms. This thereby enables pressure applied to the press section 20A in the present embodiment to be detected at high sensitivity. In the present embodiment, it is sufficient to lay the piezoelectric substrate 10 in a straight line with respect to the pressure-applied face 21. The piezoelectric substrate 10 does not need to be laid over the entire surface of the pressure-applied face 21 in, for example, a wavy shape or a flat-spiral shape. Namely, the length of the piezoelectric substrate 10 can be shortened.

Note that the method of producing the sensor module 200 of the present embodiment is the same as the production method employed in the first embodiment as described above.

Sixth Embodiment

Figure 10:
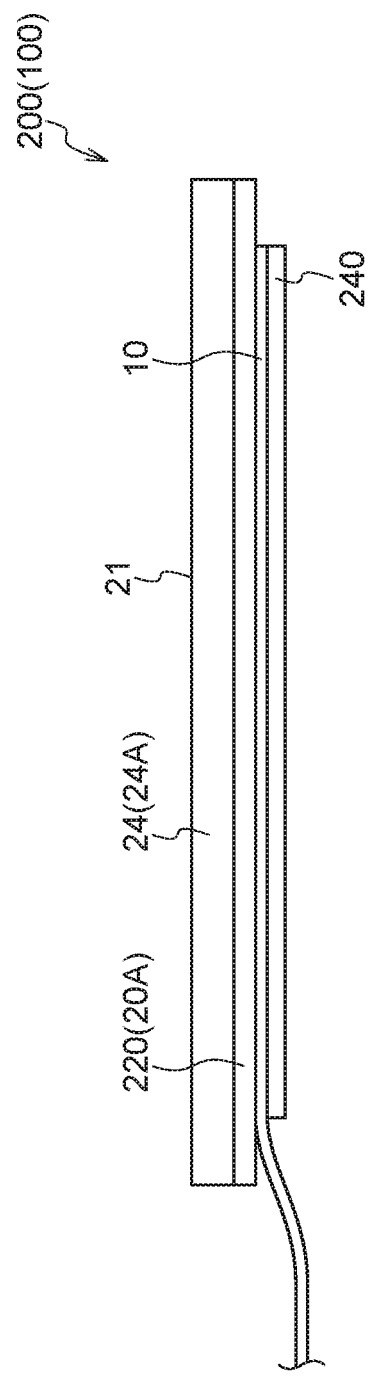
FIG. 10 is a side view of a sensor module of a sixth embodiment and an Example 2.

An attachment structure 100 and a sensor module 200 of a sixth embodiment have the following features in addition to the configuration of the third embodiment. Namely, as illustrated in FIG. 10, a feature is that a covering section 24 configured from one or plural layers is provided adjacent to the press section 20A on a pressure-applied side (i.e. on a pressure-applied face 21 side) thereof. This feature enables the substance of the pressure-applied face 21 to be selected so as to match the object it is pressed by. For example, in cases in which the sensor module 200 is employed to sense a person's touch, a soft material such as urethane can be employed for the covering section 24, this being the portion the person impacts.

Another feature is that a Young's modulus Ea of the press section 20A is greater than a Young's modulus Ed of a layer 24A of the covering section 24 adjacent to the press section 20A. This feature means that pressure is readily transmitted by the press section 20A to the piezoelectric substrate 10 even when the covering section 24 is provided on an upper portion of the press section 20A.

Seventh Embodiment

Figure 11:
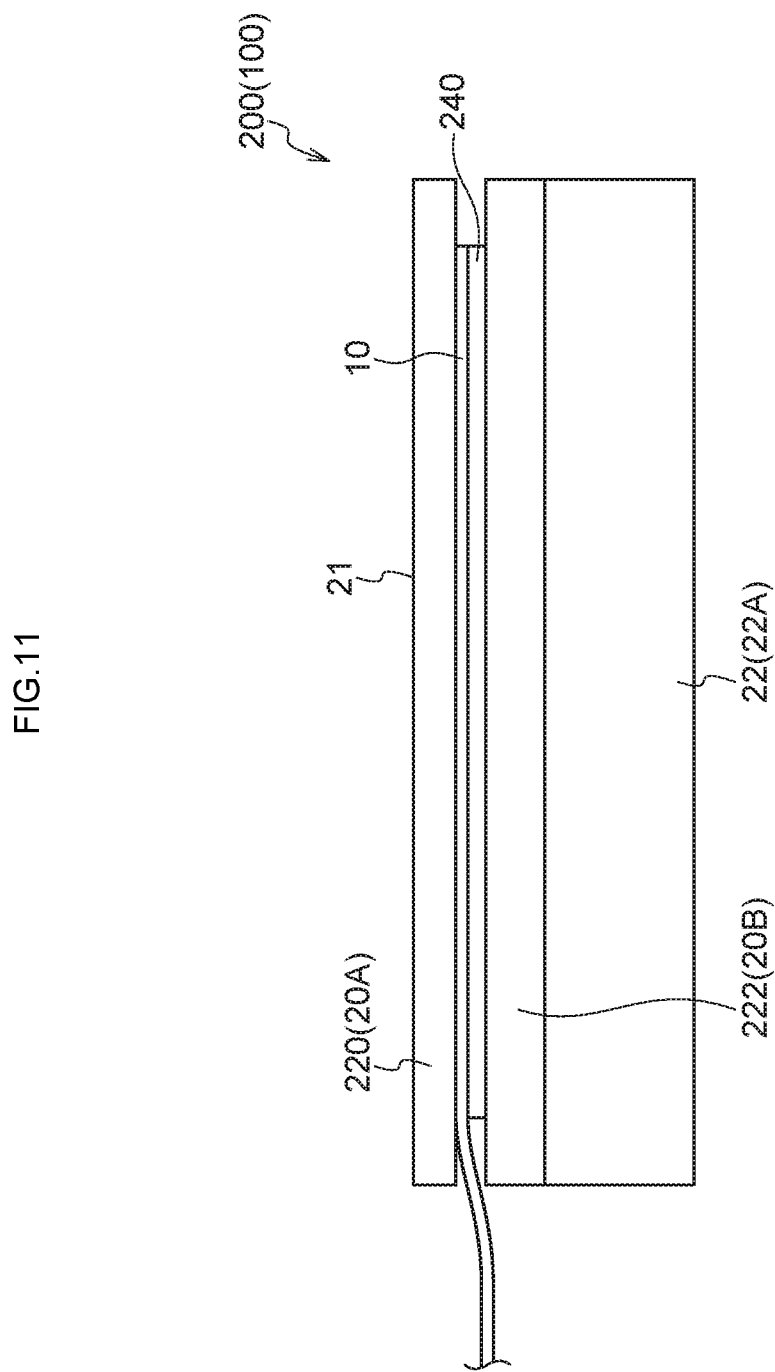
FIG. 11 is a side view of a sensor module of a seventh embodiment and an Example 3.

An attachment structure 100 and a sensor module 200 of a seventh embodiment have the following features in addition to the configuration of the first embodiment. Namely, as illustrated in FIG. 11, a feature is that a support section 22 configured from one or plural layers is provided adjacent to the base section 20B on the opposite side thereof to the piezoelectric substrate 10. This feature enables the substance of the support section 22 to be selected so as to match an object the sensor module 200 is mounted to. For example, in cases in which the sensor module 200 is employed to sense impact to a wall surface, a metal material such as an aluminum plate may be employed for the support section 22 mounted to the wall surface (a concrete surface, for example).

Another feature is that a Young's modulus Eb of the base section 20B is less than the Young's modulus Ec of a layer 22A of the support section 22 adjacent to the base section 20B. This feature means that bending and deformation of the piezoelectric substrate 10 are not impeded even when the support section 22 is provided on a lower portion of the base section 20B.

Summary of Embodiments

In each of the embodiments, when the press section 20A is pressed by contact with an object (including being pressed by shock and vibration), a signal is output due to the piezoelectric substrate 10 bending or being deformed by a shear force. Each of the embodiments accordingly functions as a pressure sensor (shock sensor, vibration sensor).

In each of the embodiments, pressure is readily transmitted by the press section 20A to the piezoelectric substrate 10, and moreover the piezoelectric substrate 10 is formed so as to readily bend, or to readily deform. Each of the embodiments enables the length of the piezoelectric substrate 10 to be shortened while still detecting pressure applied to the press section 20A at high sensitivity.

Note that each of the embodiments may be appropriately combined with other embodiments, and various aspects may be realized within a range not departing from the spirit in the invention.

The attachment structure 100 and the sensor module 200 of the present embodiments as described above may be employed in the following sensors. Examples of sensors include pressure sensors, shock sensors, vibration sensors, biodata (heartrate, breathing, movement) sensors, and the like. Such sensors may be employed by being mounted, or may be employed in structural bodies with such sensors integrated therein. Examples thereof include being employed in structural bodies that move, such as in vehicles (four-wheel vehicles, two-wheel vehicles, etc.), trains, cargo trains, ships, aircraft, bicycles, trollies, caster trucks, robots, actuators, and the like. More examples thereof include being employed in structural bodies to protect people, such as protectors, supporters, shoes, clothes, caps, helmets, and the like. Further examples thereof include being employed in in fixtures and fittings such as wall materials, windows, flooring materials, carpets, cushions, beds, chairs, vehicle seats, and the like. Examples of flooring materials include timber and plastics, tatami, artificial tatami made from resin, metal, glass, and the like.

EXAMPLES

The invention will be more specifically described below by way of Examples. As long as the invention does not depart from the spirit thereof, the invention is not limited to the following Examples.

Plural sensor modules 200 having cable-shaped piezoelectric substrates 10 laid therein were produced as Examples and Comparative Examples.

Example 1

As illustrated in FIG. 9, a sensor module 200 of Example 1 includes a plate shaped first member 220, a piezoelectric substrate 10 disposed on a lower face of the first member 220, and a pressure sensitive adhesive tape 240 fixing the piezoelectric substrate 10 to the first member 220.

<Piezoelectric Substrate Production>

A micro-slit ribbon having a thickness of 50 μm and a width of 0.6 mm was produced from a piezoelectric film (PLA film) produced in the manner described above. The micro-slit ribbon was then processed by wrapping around a tinsel wire manufactured by Meisei Industry Co., Ltd. (model no. u24) in an S winding (counterclockwise) direction at an angle of 45° to the longitudinal direction of the tinsel wire. As an outer conductor, a rolled copper foil having a width of 0.3 mm and a thickness of 30 μm was then wrapped around tightly further to the outside in a Z winding direction so that the micro-slit ribbon was not exposed to the outside, thereby producing the piezoelectric substrate 10.

Furthermore, in order to perform actual pressure detection, the piezoelectric substrate 10 was cut at 70 mm, a 60 mm portion thereof was employed as a region in measurements of actual strain (see dimension R of FIG. 16A), and a remaining portion of 10 mm was employed as an electrode connection portion to connect to a coaxial cable. The coaxial cable was connected to an electrometer 450 (see FIG. 15) for measuring charge amounts and evaluations were made.

<Sensor Module Production>

Figure 16A:
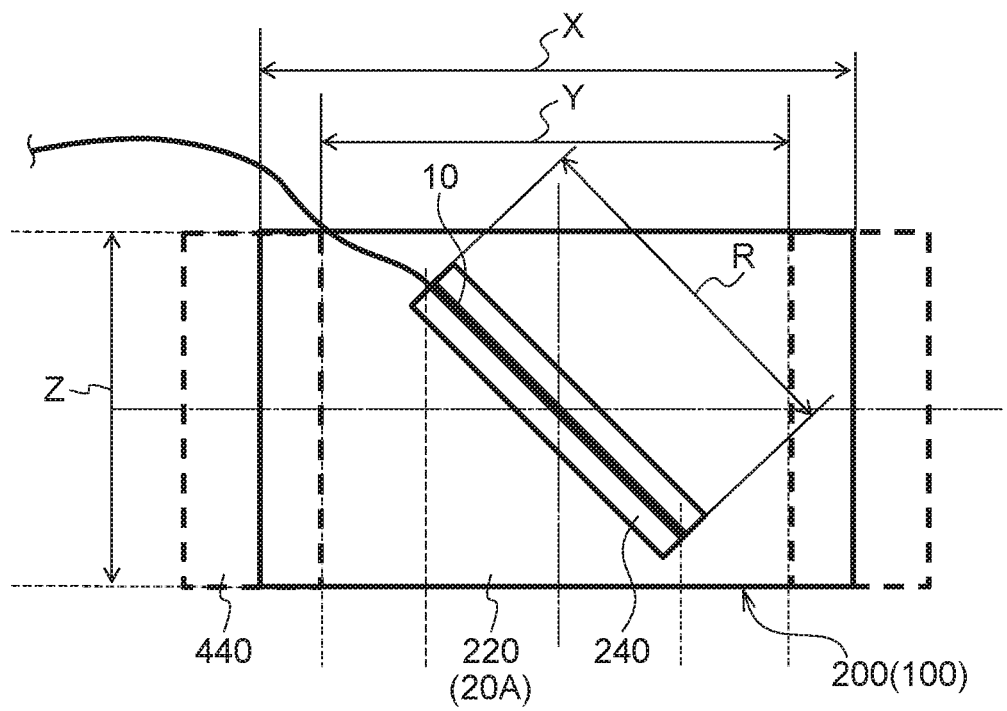
FIG. 16A is a plan view to explain a placement of a sensor module and a piezoelectric substrate in the load-application/charge-generation-amount detection instrument.

As illustrated in FIG. 16A, Example 1 was formed with a width (dimension Z) of 60 mm and a length (dimension X) of 100 mm. The first member 220 to be placed in contact with the piezoelectric substrate 10 was processed into a rectangular shape from an acrylic sheet having a thickness of 2 mm of Sumi-Holiday manufactured by HIKARI Co., Ltd. The piezoelectric substrate 10 was placed on the processed first member 220 so that the axial direction of the piezoelectric substrate 10 was oriented at 45° to the longitudinal direction of the first member 220 (see FIG. 16A). The piezoelectric substrate 10 was then moreover fixed to the first member 220 using the pressure sensitive adhesive tape 240 (a pressure sensitive adhesive tape made from a polyimide) having a thickness of 0.05 mm and a width of 10 mm. Thus in the Example 1, the piezoelectric substrate 10 was fixed in a state sandwiched by the first member 220 and the pressure sensitive adhesive tape 240.

Example 2

As illustrated in FIG. 10, a sensor module 200 of Example 2 includes a plate shaped covering section 24 (layer 24A), a plate shaped first member 220 adjacent to a lower portion of the covering section 24, a piezoelectric substrate 10 disposed on a lower face of the first member 220, and a pressure sensitive adhesive tape 240 fixing the piezoelectric substrate 10 to the first member 220.

A urethane sheet having a thickness of 6 mm manufactured by Proto Giken Inc. was employed here for the covering section 24, and a PET film having a thickness of 0.1 mm of LUMIRROR manufactured by Toray Industries Inc. was employed here for the first member 220.

Other configuration was similar to that of Example 1, and description thereof is omitted.

Example 3

As illustrated in FIG. 11, an sensor module 200 of an Example 3 includes a plate shaped first member 220, a piezoelectric substrate 10 disposed on a lower portion of the first member 220, and a pressure sensitive adhesive tape 240 fixing the piezoelectric substrate 10 to the first member 220. The sensor module 200 of Example 3 also includes a plate shaped second member 222 adjacent to a lower portion of the pressure sensitive adhesive tape 240, and a plate shaped support section 22 (layer 22A) adjacent to a lower portion of the second member 222.

An acrylic sheet having a thickness of 2 mm of Sumi-Holiday manufactured by HIKARI Co., Ltd. was employed here for the first member 220, a urethane sheet having a thickness of 6 mm manufactured by Proto Giken Inc. was employed here for the second member 222, and an aluminum plate having a thickness of 10 mm was employed for the support section 22.

Other configuration thereof is similar to that of Example 1, and description thereof is omitted.

Example 4

Figure 12:
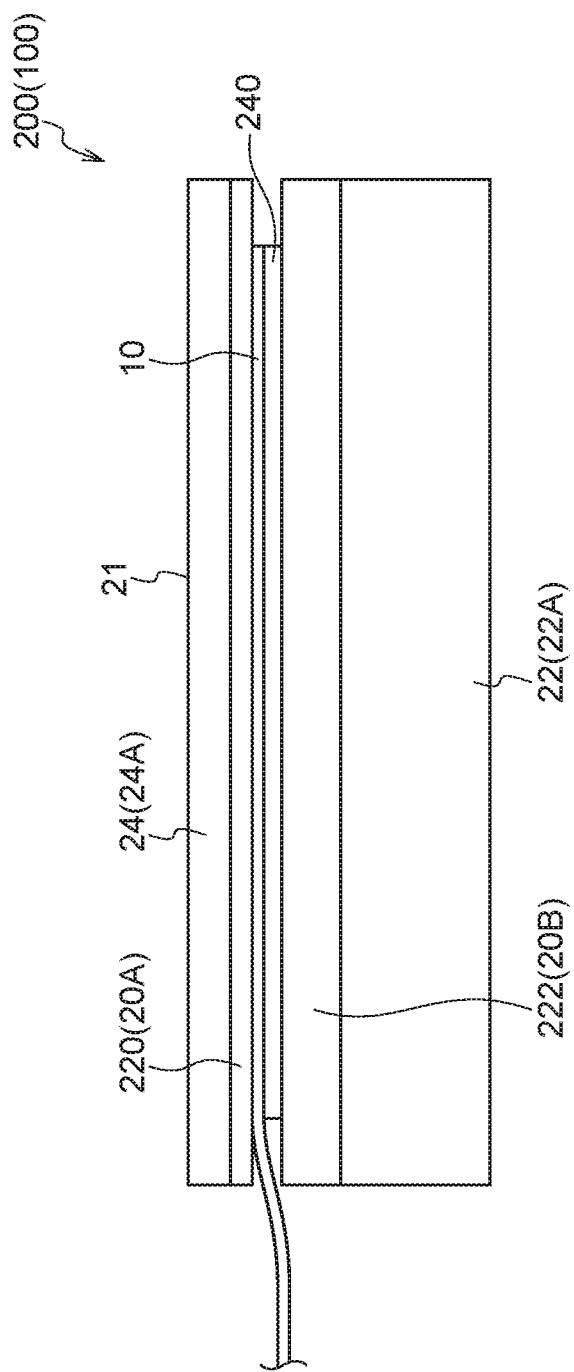
FIG. 12 is a side view of a sensor module of an Example 4.

As illustrated in FIG. 12, an sensor module 200 of an Example 4 includes a plate shaped covering section 24 (layer 24A), a plate shaped first member 220 adjacent to a lower portion of the covering section 24, a piezoelectric substrate 10 disposed on a lower face of the first member 220, and a pressure sensitive adhesive tape 240 fixing the piezoelectric substrate 10 to the first member 220. The sensor module 200 of Example 4 moreover also includes a plate shaped second member 222 adjacent to a lower portion of the pressure sensitive adhesive tape 240, and a plate shaped support section 22 (layer 22A) adjacent to a lower portion of the second member 222.

A urethane sheet having a thickness of 6 mm manufactured by Proto Giken Inc. was employed here for the covering section 24, a PET film having a thickness of 0.1 mm of LUMIRROR manufactured by Toray Industries Inc. was employed here for the first member 220, a urethane sheet having a thickness of 6 mm manufactured by Proto Giken Inc. was employed here for the second member 222, and an aluminum plate having a thickness of 10 mm was employed here for the support section 22.

Other configuration thereof is similar to that of Example 1, and description thereof is omitted.

Comparative Example 1

Figure 13:
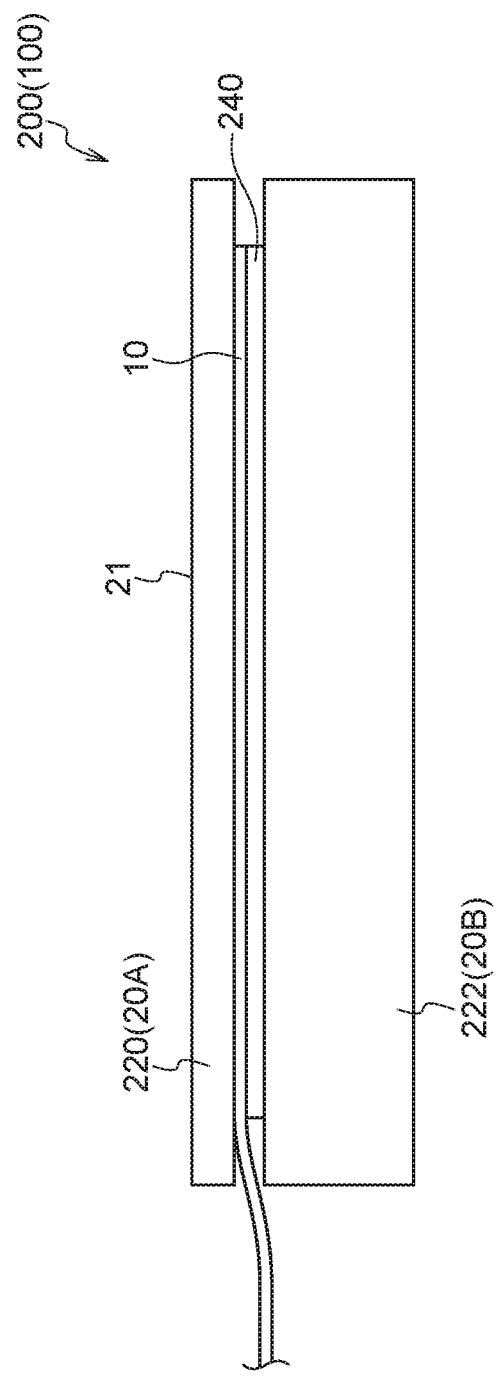
FIG. 13 is a side view of a sensor module of an Comparative Example 1.

As illustrated in FIG. 13, a sensor module 200 of a Comparative Example 1 includes a plate shaped first member 220, a piezoelectric substrate 10 disposed on a lower face of the first member 220, a pressure sensitive adhesive tape 240 fixing the piezoelectric substrate 10 to the first member 220, and a plate shaped second member 222 adjacent to a lower portion of the pressure sensitive adhesive tape 240.

An acrylic sheet having a thickness of 2 mm of Sumi-Holiday manufactured by HIKARI Co., Ltd. was employed here for the first member 220, and an aluminum plate having a thickness of 10 mm was employed for the second member 222.

Other configuration thereof is similar to that of Example 1, and description thereof is omitted.

Comparative Example 2

As illustrated in FIG. 14, a sensor module 200 of a Comparative Example 2 includes a plate shaped covering section 24 (layer 24A), a plate shaped first member 220 adjacent to a lower portion of the covering section 24, a piezoelectric substrate 10 disposed on a lower face of the first member 220, and a pressure sensitive adhesive tape 240 fixing the piezoelectric substrate 10 to the first member 220. The sensor module 200 of Comparative Example 2 moreover also includes a plate shaped second member 222 adjacent to a lower portion of the pressure sensitive adhesive tape 240.

A urethane sheet having a thickness of 6 mm manufactured by Proto Giken Inc. was employed here for the covering section 24, a PET film having a thickness of 0.1 mm of LUMIRROR manufactured by Toray Industries Inc. was employed here for the first member 220, and an aluminum plate having a thickness of 10 mm was employed for the second member 222.

Other configuration thereof is similar to that of Example 1, and description thereof is omitted.

The following measurements and evaluations were performed on each of the examples and comparative examples produced as described above.

<Young's Modulus>

The Young's modulus of each member configuring the sensor modules 200 was measured using a tensile test method according to JIS K7127 and employing a dumbbell shaped No. 1 test piece as defined by JIS K6251. The Young's modulus of the first member 220 was found from the slope of an elastic region (linear portion) of a stress-strain graph obtained by load application performed as described later.

Influence from the pressure sensitive adhesive tape 240 was ignored when performing the following measurements and evaluations.

<Voltage Sensitivity Measurement>

The sensor modules 200 produced as described above were set in a load-application/charge-generation-amount detection device 400, and voltage sensitivity measurements were performed thereon. As illustrated in FIG. 15, the load-application/charge-generation-amount detection device 400 employed here included a tensile tester 410 (TENSILON RTG-1250 tensile tester manufactured by A&D Company, Ltd), an electrometer 450, an AD converter 452, and an analysis PC 454. The tensile tester 410 further included an up-down movable crosshead 415, a load cell 420 fixed to the crosshead 415, a push-rod 425 installed on the leading end of the load cell 420, and a mounting table 430 for placing objects to be measured on. A pair of left and right support sections 440 are provided here on the mounting table 430 to support the sensor modules 200. A distance Y between the left and right support sections 440 is set at 80 mm (see FIG. 15 and FIG. 16A).

The charge generated in the piezoelectric substrate 10 is detected in the electrometer 450. The charge detected by the electrometer 450, a load detected by the load cell 420, and a strain value of a movement amount of the crosshead 415, are each input to the AD converter 452. Information that has been digitalized by the AD converter 452 is then output to the analysis PC 454, and each of the detected values is computed in the analysis PC 454.

(Generated Voltage)

Figure 16B:
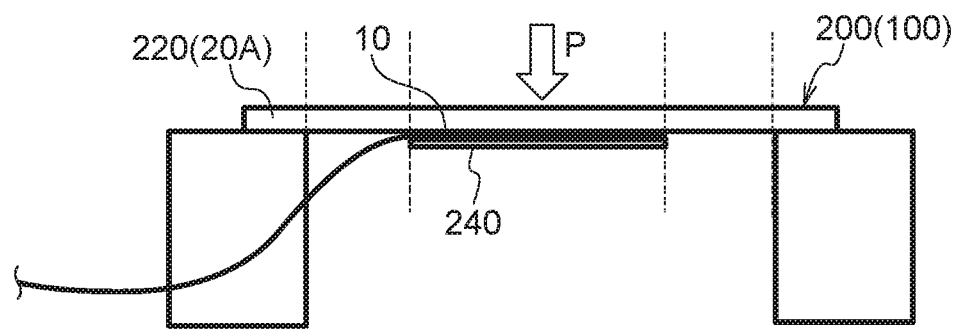
FIG. 16B is a face-on view to explain the placement of the sensor module and the piezoelectric substrate in the load-application/charge-generation-amount detection instrument.

As illustrated in FIG. 15, FIG. 16A, and FIG. 16B, the two end portions of the sensor module 200 are placed on the support sections 440, and when a central portion of the pressure-applied face 21 of the sensor module 200 is pressed by the push-rod 425, tension is applied to the piezoelectric line accompanying bending deformation of the sensor module 200, and charge is generated by a piezoelectric effect. This charge is read by the electrometer 450 (an electrometer 6514 manufactured by Keithley Instruments, Inc.). The amount of charge read here is then divided by an electrostatic capacitance 41 pF of the sensor to obtain a value for the generated voltage.

(Voltage Sensitivity)

Measurement of voltage sensitivity is performed by causing the push-rod 425 to perpendicularly contact a central portion of the pressure-applied face 21 of the sensor module 200, and by applying load with a crosshead speed of 1 mm per minute. The load is measured by the load cell 420 of the tensile tester 410, and after a load of 5 N has been reached, the load is then reduced by reversing the movement direction of the crosshead 415. After the load has reached 1 N, the movement direction of the crosshead 415 is again reversed. The load is then increased again, and then reduced after a force of 5 N has been reached.

This cycle is performed for five cycles, and measurement values plotted with the load on the X-axis, and the generated voltage on the Y-axis. A straight line approximation thereof was then made using a least squares method, and the slope of the straight line indicating the generated voltage (V) per unit force (N) was taken as the voltage sensitivity.

Table 1 below summarizes the examples and comparative examples, and lists the configuration and evaluation results for Examples 1 to 4 and Comparative Examples 1 and 2.

TABLE 1

| | | Example 1 | Example 2 | Example 3 | Example 4 | Comparative Example 1 | Comparative Example 2 |
|---|---|---|---|---|---|---|---|
| Covering section | Substance | | urethane | | urethane | | urethane |
| | Thickness (mm) | | 6 | | 6 | | 6 |
| | Young's modulus Ed (GPa) | | 0.03 | | 0.03 | | 0.03 |
| Press section (first member) | Substance | acrylic | PET film | acrylic | PET film | acrylic | PET film |
| | Thickness (mm) | 2 | 0.1 | 2 | 0.1 | 2 | 0.1 |
| | Young's modulus Ea (GPa) | 3 | 4 | 3 | 4 | 3 | 4 |
| Base section (second member) | Substance | | | urethane | urethane | aluminum | aluminum |
| | Thickness (mm) | | | 6 | 6 | 10 | 10 |
| | Young's modulus Eb (GPa) | | | 0.03 | 0.03 | 70 | 70 |
| Support section | Substance | | | aluminum | aluminum | | |
| | Thickness (mm) | | | 10 | 10 | | |
| | Young's modulus Ec (GPa) | | | 70 | 70 | | |

TABLE 1-continued

| | | Example | | | | Comparative Example 1 | Comparative Example 2 |
|---|---|---|---|---|---|---|---|
| | | Example 1 | Example 2 | Example 3 | Example 4 | | |
| Evaluation | Voltage sensitivity (V/N) | 0.226 | 1.756 | 0.563 | 0.163 | 0.123 | 0.074 |
| | Young's modulus ratio Eb/Ea | — | — | 1.0E−02 | 7.5E−03 | 2.3E+01 | 1.8E+01 |

(Description of Table 1)

The notation "(value a)E(value b)" represents "(value a)×10$^{(value\ b)}$". For example, the notation "7.5E-03" represents $7.5 \times 10^{-3}$.

The examples had voltage sensitivities in the range of from 0.163 to 1.756 V/N, and the comparative examples had voltage sensitivities in the range of from 0.074 to 0.123 V/N. A range of 0.16 V/N and above is preferable in order to detect at high sensitivity even low pressure of the order of a person's touch.

A Young's modulus comparative ratio Eb/Ea can be said to be a preferable value of $1.0 \times 10^{-2}$ or lower for Examples 3 and 4, and for Comparative Examples 1 and 2. Namely, a configuration formed such that the Young's modulus ratio Eb/Ea is $10^{-2}$ or lower can be said to result in the following. It was confirmed that pressure is readily transmitted to the piezoelectric substrate 10 by the press section 20A (i.e. the first member 220) irrespective of the pressed location on the pressure-applied face 21, and that the piezoelectric substrate 10 readily bends (or in other words, readily deforms) in the pressure-application direction in the base section 20B (i.e. the second member 222). A consideration of the Young's moduli of known materials indicates that the piezoelectric substrate 10 readily bends in the pressure-application direction as long as the Young's modulus ratio Eb/Ea is $10^4$ or lower.

In the Examples 3 and 4, the Young's modulus Ea of the press section 20A is in a range of from $10^{-2}$ to $10^1$ GPa, and the Young's modulus Eb of the base section 20B is in a range of from $10^{-3}$ to $10^4$ GPa. In the Examples 1 and 2, the Young's modulus Ea of the press section 20A is also in a range of from $10^{-3}$ to $10^1$ GPa.

In Examples 2 and 4, a comparative ratio of the Young's modulus Ea of the press section 20A and the Young's modulus Ed of the layer 24A of the covering section 24 adjacent to the press section 20A satisfies the relationship Ea>Ed. Namely, confirmation has been made that pressure is readily transmitted to the piezoelectric substrate 10 by the press section 20A even when the covering section 24 is provided on an upper portion of the press section 20A.

In Examples 3 and 4, a comparative ratio of the Young's modulus Eb of the base section 20B and the Young's modulus Ec of the layer 22A of the support section 22 adjacent to the base section 20B satisfies the relationship Eb<Ec. Namely, confirmation was made that bending (in other words deformation) of the piezoelectric substrate 10 is not impeded even when the support section 22 is provided on a lower portion of the base section 20B.

From the above it is apparent that each of the examples detects pressure applied to the press section 20A at high sensitivity. Moreover, the length of the piezoelectric substrate 10 can be shortened due to the piezoelectric substrate 10 not need to be laid over the entire surface of the pressure-applied face 21.

The entire content of the disclosure of Japanese Patent Application No. 2016-188600 filed on Sep. 27, 2016 is incorporated by reference in the present specification.

All publications, patent applications and technical standards mentioned in the present specification are incorporated by reference in the present specification to the same extent as if each individual publication, patent application, or technical standard was specifically and individually indicated to be incorporated by reference.

REFERENCE SIGNS LIST 10, 10A, 10B Piezoelectric substrate
12A Inner conductor
14A First piezoelectric material
14B Second piezoelectric material
Insulating yarn
20A Press section
20B Base section
Pressure-applied face
Support section
22A Layer of support section adjacent to base section
Covering section
24A Layer of covering section adjacent to press section
100 Piezoelectric substrate attachment structure
210 Main body
220 First member
222 Second member
240 Pressure sensitive adhesive tape

The invention claimed is:

1. A piezoelectric substrate attachment structure comprising:
    a cable-shaped piezoelectric substrate;
    a press section provided adjacent to the piezoelectric substrate and being continuously fixed directly to the piezoelectric substrate along an axial direction of the piezoelectric substrate and pressed from an opposite side from the piezoelectric substrate; and
    a base section provided adjacent to the piezoelectric substrate on an opposite side from the press section,
    the piezoelectric substrate including an elongate conductor and a helical chiral polymer wound around an outer periphery of the conductor and having optical activity,
    the piezoelectric substrate including a piezoelectric substrate in which polarization occurs in a radial direction against an axial stress, and
    a ratio Eb/Ea of a Young's modulus Eb of the base section to a Young's modulus Ea of the press section being $10^{-1}$ or lower.

2. The piezoelectric substrate attachment structure of claim 1, wherein the Young's modulus Ea of the press section is in a range of from $10^{-6}$ to $10^3$ GPa, and the Young's modulus Eb of the base section is in a range of from $10^{-7}$ to $10^1$ GPa.

3. The piezoelectric substrate attachment structure of claim 1, wherein the Young's modulus Ea of the press section is in a range of from $10^{-3}$ to $10^3$ GPa, and the Young's modulus Eb of the base section is in a range of from $10^{-5}$ to $10^1$.

4. The piezoelectric substrate attachment structure of claim 1, wherein the Young's modulus Ea of the press section is in a range of from $10^{-2}$ to $10^1$ GPa, and the Young's modulus Eb of the base section is in a range of from $10^{-3}$ to $10^{-1}$ GPa.

5. The piezoelectric substrate attachment structure of claim 1, wherein a support section configured from one or a plurality of layers is provided adjacent to the base section on an opposite side from the piezoelectric substrate.

6. The piezoelectric substrate attachment structure of claim 5, wherein the Young's modulus Eb of the base section is lower than a Young's modulus Ec of a layer of the support section adjacent to the base section.

7. A sensor module comprising:
- a cable-shaped piezoelectric substrate;
- a press section provided adjacent to the piezoelectric substrate and pressed from an opposite side from the piezoelectric substrate; and
- a base section provided adjacent to the piezoelectric substrate on an opposite side from the press section,
- a main body, to which the piezoelectric substrate is continuously fixed directly along an axial direction of the piezoelectric substrate, being configured by an integrated unit of the press section and the base section,
- the piezoelectric substrate including an elongate conductor and a helical chiral polymer wound around an outer periphery of the conductor and having optical activity,
- the piezoelectric substrate including a piezoelectric substrate in which polarization occurs in a radial direction against an axial stress, and
- a Young's modulus Ef of the main body being in a range of from $10^{-3}$ to $10^1$ GPa.

8. The sensor module of claim 7, wherein a thickness of the press section in a direction of adjacency to the piezoelectric substrate is greater than a thickness of the base section in the adjacency direction.

9. A piezoelectric substrate attachment structure comprising:
- a cable-shaped piezoelectric substrate; and
- a press section provided adjacent to the piezoelectric substrate and being continuously fixed directly to the piezoelectric substrate along an axial direction of the piezoelectric substrate and pressed from an opposite side from the piezoelectric substrate,
- the piezoelectric substrate including an elongate conductor and a helical chiral polymer wound around an outer periphery of the conductor and having optical activity,
- the piezoelectric substrate including a piezoelectric substrate in which polarization occurs in a radial direction against an axial stress, and
- a Young's modulus Ea of the press section being in a range of from $10^{-3}$ to $10^1$ GPa.

10. The piezoelectric substrate attachment structure of claim 1, further comprising a covering section configured from one or a plurality of layers provided adjacent to the press section on a pressure-applied side thereof.

11. The piezoelectric substrate attachment structure of claim 10, wherein the Young's modulus Ea of the press section is greater than a Young's modulus Ed of a layer of the covering section adjacent to the press section.

12. A piezoelectric substrate attachment structure comprising:
- a cable-shaped piezoelectric substrate; and
- a press section provided adjacent to the piezoelectric substrate and being continuously fixed directly to the piezoelectric substrate along an axial direction of the piezoelectric substrate and pressed from an opposite side from the piezoelectric substrate,
- the piezoelectric substrate including an elongate conductor and a helical chiral polymer wound around an outer periphery of the conductor and having optical activity,
- the piezoelectric substrate including a piezoelectric substrate in which polarization occurs in a radial direction against an axial stress, and
- a length of the piezoelectric substrate adjacent to the press section being different from a length of a contact portion of the piezoelectric substrate contacting the press section.

13. The sensor module of claim 7, wherein the press section is in direct contact with the piezoelectric substrate in the axial direction of the piezoelectric substrate.

* * * * *